(12) United States Patent
Ito et al.

(10) Patent No.: US 7,511,522 B2
(45) Date of Patent: Mar. 31, 2009

(54) ELECTRONIC DEVICE TEST APPARATUS

(75) Inventors: Akihiko Ito, Tokyo (JP); Kazuyuki Yamashita, Tokyo (JP)

(73) Assignee: Advantest Corporation, Tokyo (JP)

( * ) Notice: Subject to any disclaimer, the term of this patent is extended or adjusted under 35 U.S.C. 154(b) by 40 days.

(21) Appl. No.: 10/558,385

(22) PCT Filed: May 28, 2004

(86) PCT No.: PCT/JP2004/007363

§ 371 (c)(1),
(2), (4) Date: Sep. 12, 2006

(87) PCT Pub. No.: WO2004/106945

PCT Pub. Date: Dec. 9, 2004

(65) Prior Publication Data

US 2007/0069752 A1 Mar. 29, 2007

(30) Foreign Application Priority Data

May 30, 2003 (WO) .................. PCT/JP03/06835

(51) Int. Cl.
*G01R 31/02* (2006.01)
(52) U.S. Cl. .................................... 324/758; 324/158.1
(58) Field of Classification Search ......... 324/754–755, 324/758, 765, 158.1; 209/573; 414/222
See application file for complete search history.

(56) References Cited

U.S. PATENT DOCUMENTS

| 4,980,971 A | * | 1/1991 | Bartschat et al. | 29/833 |
| 5,084,959 A | * | 2/1992 | Ando et al. | 29/740 |
| 5,113,132 A | * | 5/1992 | Hoshi | 324/758 |
| 5,481,202 A | * | 1/1996 | Frye, Jr. | 324/754 |
| 5,547,537 A | * | 8/1996 | Reynolds et al. | 156/351 |
| 5,694,219 A | * | 12/1997 | Kim | 356/615 |

(Continued)

FOREIGN PATENT DOCUMENTS

JP 6-309436 A 11/1994

(Continued)

*Primary Examiner*—Ha Tran T Nguyen
*Assistant Examiner*—Arleen M Vazquez
(74) *Attorney, Agent, or Firm*—Birch, Stewart, Kolasch & Birch, LLP

(57) ABSTRACT

An electronic device test apparatus for testing IC chips (IC) by pushing their input/output terminals (HB) against contact units of a test head, provided with an IC moving system (410) for picking up and moving an IC chip (IC) at the front surface where input/output terminals (HB) are led out, a first camera for capturing an image of the front surface of an IC chip (IC) before being picked up, a second camera for capturing an image of a back surface of an IC chip (IC) after being picked up, and an image processing system for calculating the position of input/output terminals (HB) of an IC chip (IC) picked up by the IC moving system (410) from the image information captured by the first camera and second camera and identifying the relative position of the IC chip (IC) picked up by the IC moving system (410) with respect to a contact unit based on the results of calculation, wherein the IC moving system (410) corrects the position of the IC chip based on the relative position of the input/output terminals (HB) of the IC chip (IC) with respect to the contact unit identified by the image processing system.

19 Claims, 19 Drawing Sheets

U.S. PATENT DOCUMENTS

| | | | |
|---|---|---|---|
| 5,794,526 A * | 8/1998 | Raney | 100/39 |
| 5,946,409 A * | 8/1999 | Hori | 382/149 |
| 5,956,134 A * | 9/1999 | Roy et al. | 356/237.5 |
| 6,150,828 A * | 11/2000 | Farnworth et al. | 324/758 |
| 6,707,552 B2 * | 3/2004 | Gilmore et al. | 356/400 |
| 6,873,169 B1 * | 3/2005 | Ham et al. | 324/755 |
| 2003/0041656 A1 * | 3/2003 | Neo et al. | 73/105 |
| 2006/0290369 A1 * | 12/2006 | Yamashita et al. | 324/765 |

FOREIGN PATENT DOCUMENTS

| | | |
|---|---|---|
| JP | 9-211067 A | 8/1997 |
| JP | 2002-257900 A | 9/2002 |

* cited by examiner

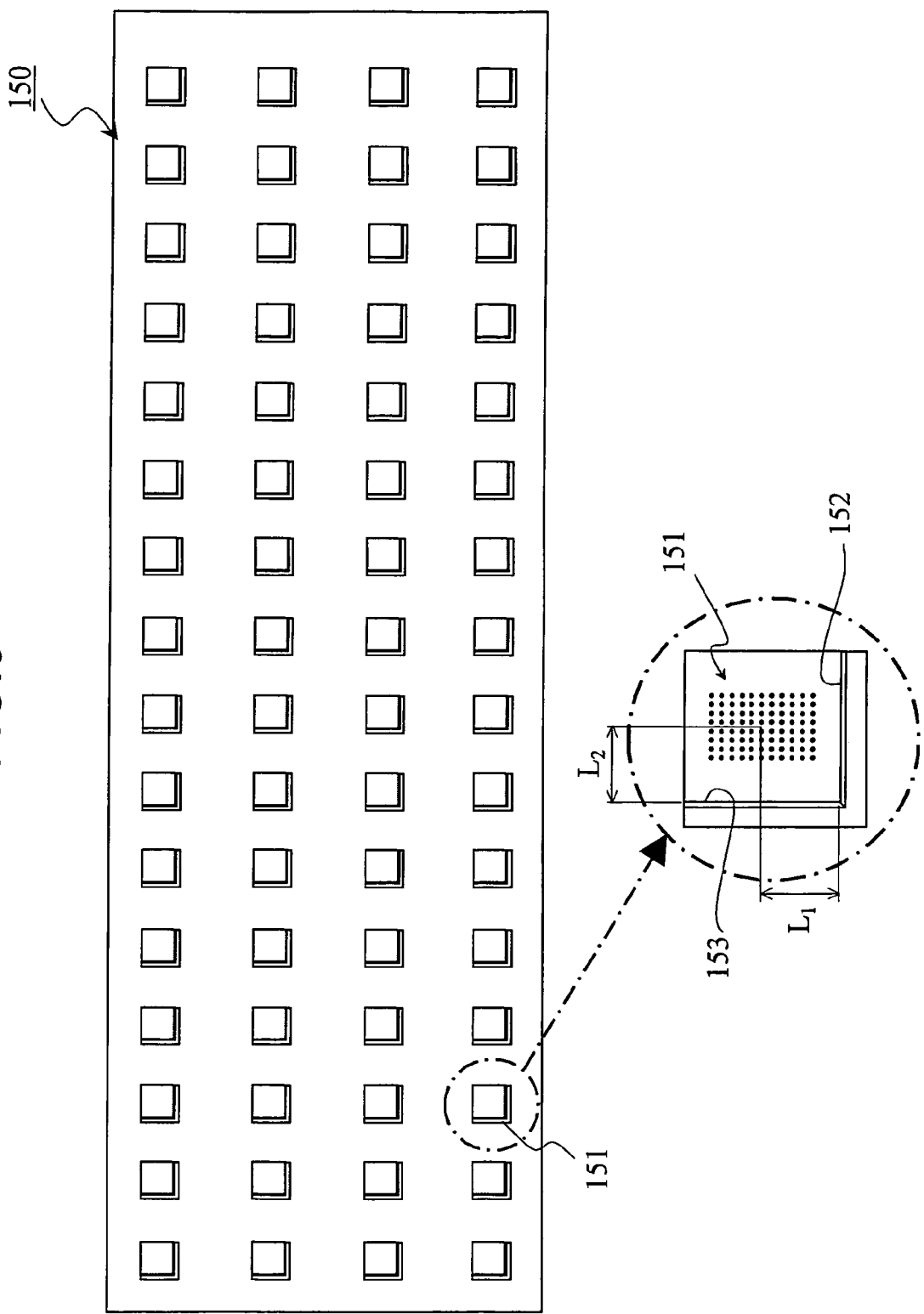

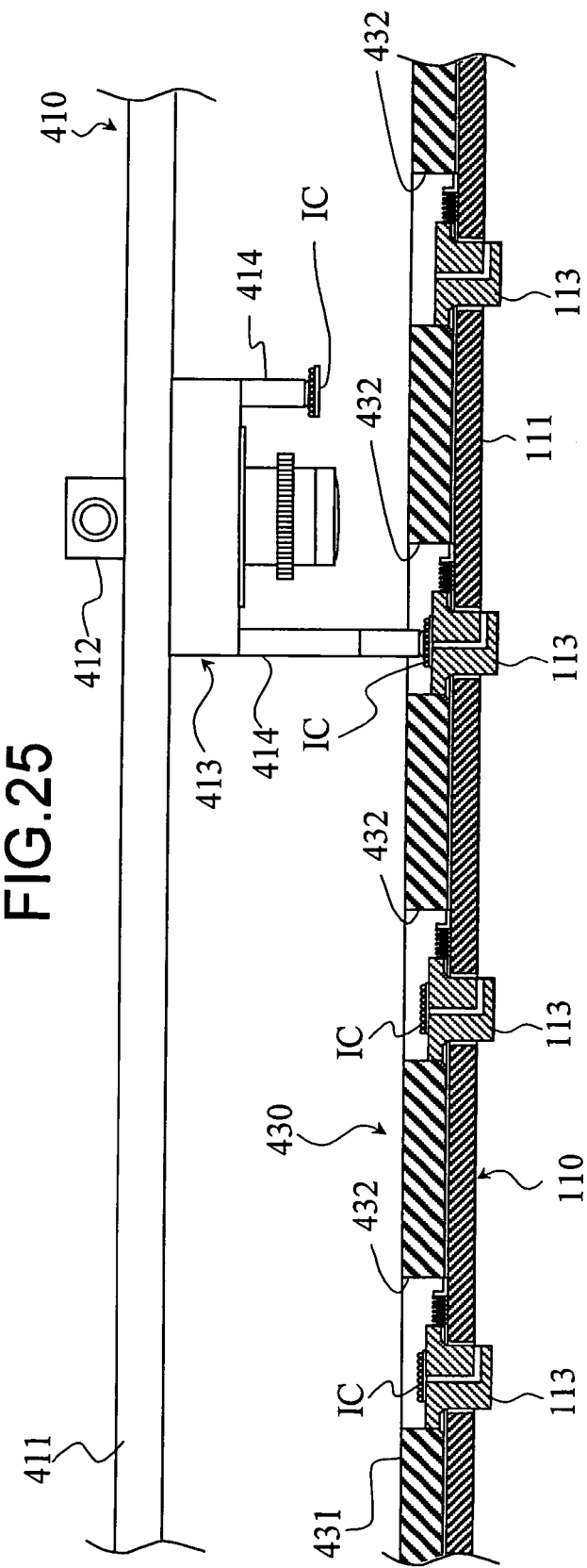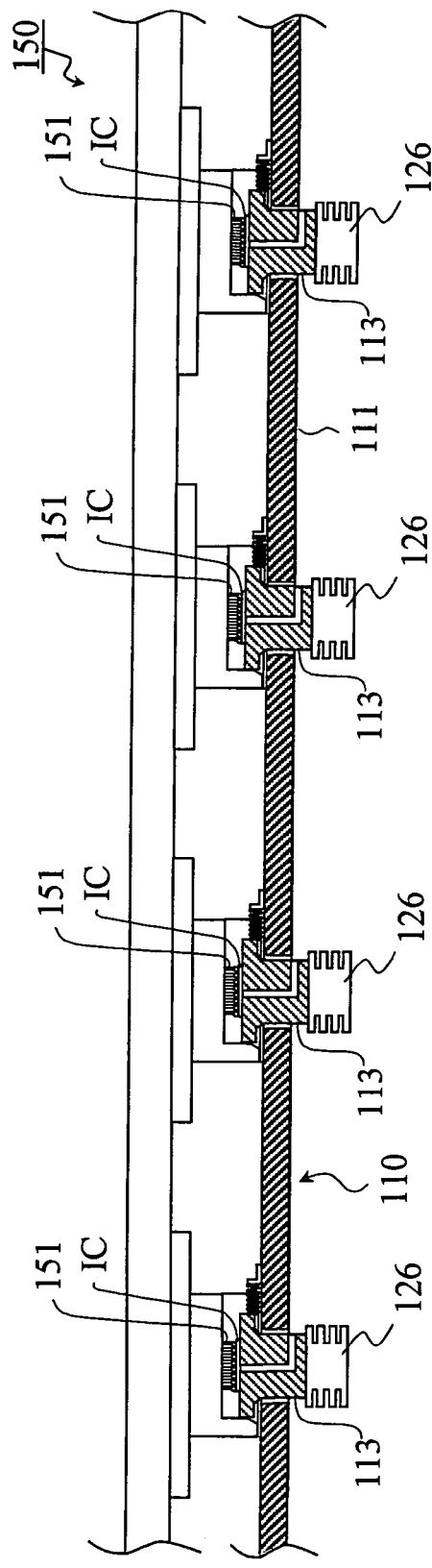

ELECTRONIC DEVICE TEST APPARATUS

BACKGROUND OF THE INVENTION

1. Field of the Invention

The present invention relates to an electronic device test apparatus for testing semiconductor integrated circuit devices and various other electronic devices (hereinafter also referred to representatively as "IC chips"), more particularly relates to an electronic device test apparatus enabling a large number of types of electronic devices under test ("DUTs") to be easily handled.

2. Description of the Related Art

In an IC test apparatus (electronic device test apparatus) called a "handler", a large number of IC chips stored on a tray are conveyed inside the handler, the IC chips are brought into electrical contact with a test head, and the electronic device test apparatus unit (hereinafter, also referred to as a "tester") is made to conduct the tests. Further, after the tests are completed, the IC chips are ejected from the test head and transferred onto a tray in accordance with the test results to thereby separate the chips into good ones and defective ones.

In general, in an electronic device test apparatus for testing memory IC chips, which require a relatively long test time (hereinafter, also referred to as "memory ICs") (hereinafter, also referred to as a "memory IC test apparatus"), a larger number of IC chips are transferred before and after the tests between trays storing before-test/after-test IC chips (hereinafter, also referred to as "customer trays") and trays conveyed circulated within the electronic device test apparatus (hereinafter, also referred to as "test trays"). The IC chips are passed through chambers of high temperature or low temperature environments where they are subjected to high temperatures or low temperatures of −55 to 150° C. or so and are simultaneously pushed against the test head for testing in the state placed on the test trays.

As a test tray used in such a memory IC test apparatus, one is known which is provided with a plurality of inserts for holding the IC chips and inserts guide pins provided at contact units of the test head into guide holes formed at the inserts when pushing the IC chips against the test head so as to accurately position the input/output terminals of the IC chips and the contact pins of the contact units to thereby prevent poor contact at the time of tests (for example, see Japanese Patent Publication (A) No. 2001-33519).

However, the inserts provided at such a test tray are designed to constrain the movement of the IC chips based on the outside shapes of the IC chips, that is, are dedicated units designed for the outside shapes of specific types of IC chips. It is therefore necessary to prepare in advance test trays provided with inserts corresponding to the specific types of IC chips and necessary to exchange the test trays with ones designed to handle the types of the IC chips being tested each time the types of the IC chips under test change. Therefore, in a memory IC test apparatus using such test trays, the exchange time when changing types of IC chips cannot be shortened. In particular, it is not possible to increase the efficiency of tests when testing small amounts of a variety of types of devices.

As opposed to this, as a memory IC test apparatus able to easily handle a large variety of types of IC chips, one which employs a test plate having substantially smooth holding surfaces in place of such test trays and uses these smooth holding surfaces to hold the back surfaces of the IC chips where input/output terminals are not led out may be considered. Due to this, it would be possible to hold IC chips without regard as to the outside shapes of the IC chips, so there would no longer be a need to prepare test trays for specific types of IC chips and exchange of trays at the time of changing types of IC chips tested would become unnecessary. This could therefore be an effective means for realizing a memory IC test apparatus able to easily handle a large variety of types of IC chips.

On the other hand, as an electronic device test apparatus for logic IC chips, where the test times are shorter than with memory ICs (hereinafter, also referred to as a "logic IC test apparatus"), one is known which does not use the above test trays, but uses a CCD camera and an image processing system etc. to compute the relative position of an IC chip with respect to a contact unit and positions that IC chip relative to it by a moving means with a high precision based on the results of computation. This enables poor contact at the time of testing to be prevented without regard as to the outside shapes of the IC chips (for example, see WO03/075023 pamphlet).

The method of using this image processing enables high precision positioning of the IC chips allowing even variation in the relative positions of the input/output terminals with respect to the outside shapes of the IC chips arising in the production process, it it may be considered effective to apply this to a memory IC test apparatus using the above test plate so as to prevent poor contact. However, in having holding surfaces of the test plate hold the back surfaces of IC chips where input/output terminals are not led out, the moving means has to pick up the front surfaces of the IC chips where the input/output terminals are led out, so the moving means becomes an obstacle when the CCD camera captures images of them, it is difficult to accurately capture image of the input/output terminals of the IC chips, high precision positioning of the IC chips is not possible, and poor contact cannot be sufficiently prevented. This is particularly true in ultra small IC chips such as the recent flash memories.

SUMMARY OF THE INVENTION

An object of the present invention is to provide an electronic device test apparatus able to easily handle a large number of types of DUTs, more particularly an electronic device test apparatus able to prevent poor contact of DUTs with respect to a test head.

To achieve this object, according to a first aspect of the present invention, there is provided an electronic device test apparatus for testing DUTs by pushing their input/output terminals against contact units of a test head, provided with at least a moving means for picking up and moving the DUTs, a first imaging means for capturing an image of one main surface of a DUT before being picked up by the moving means, a second imaging means for capturing an image of another main surface of a DUT after being picked up by a moving means, and an identifying means for calculating the position and posture of the DUT picked up by the moving means from the image information captured by the first imaging means and the second imaging means and identifying the relative position and posture of the DUT picked up by the moving means with respect to a contact unit based on the results of calculation, wherein the moving means corrects the position and posture of the DUT based on the relative position and posture of the DUT identified by the identifying means.

More preferably, the identifying means calculates the position and posture of the outside shape of the one main surface in the DUT before being picked up by the moving means and the position and posture of the input/output terminals of the DUT before being picked up by the moving means from image information captured by the first imaging means, calculates the position and posture of the outside shape of the other main surface in the DUT after being picked up by the moving means from image information captured by the second imaging means, and calculates the position and posture of the input/output terminals of the DUT after being picked up by the moving means based on the results of calculations.

In the present invention, before and after the moving means picks up a DUT, the first and second imaging means capture images of the two main surfaces of the DUT, the identifying means calculates the position and posture of the uncapturable input/output terminals of the DUT after being picked up from that captured image information and identifies the relative position and posture of the DUT with respect to the corresponding contact unit based on the results of calculation, and the moving means corrects the position and posture of the DUT based on the results of identification. Due to this, even when the IC move system picks up the surface of a DUT where input/output terminals are led out for move of the DUT along with use of the above test plate so as to facilitate handling of various types of DUTs, it becomes possible to judge the position and posture of the input/output terminals of the DUT after being picked up by the moving means, possible to position the DUT with respect to the corresponding contact unit with a high precision, and possible to prevent poor contact at the time of testing.

Alternatively, the electronic device test apparatus is further providing with a third imaging means for capturing an image of the other main surface of the DUT before being picked up by the moving means, and the identifying means calculates the position and posture of the input/output terminals of the DUT after being picked up by the moving means from the image information captured by the first imaging means, second imaging means, and third imaging means and identifies the relative position and posture of the DUT after being picked up by the moving means with respect to the contact unit based on the results of these calculations.

Further, preferably the identifying means calculates the position and posture of the input/output terminals of the DUT before being picked up by the moving means from the image information captured by the first imaging means, calculates the position and posture of the outside shape of the other main surface of the DUT before being picked up by the moving means from the image information captured by the third imaging means, calculates the position and posture of the outside shape of the other main surface at the DUT picked up by the moving means from the image information captured by the second imaging means, and calculates the position and posture of the input/output terminals of the DUT picked up by the moving means based on the results of these calculations.

In the present invention, by providing the third imaging means, using this third imaging means to capture the image of the other main surface of a DUT in the state before being picked up by the moving means, and having the identifying means to calculate the position and posture of the input/output terminals of the DUT picked up by the moving means considering that image information, even if variations in DUTs caused in the production process result in some differences in the outside shapes of the two main surfaces of the DUT, it is possible to accurately identify the relative position and posture of the DUT with respect to the corresponding contact unit.

Preferably, the moving means has suction means for holding and picking up the DUT by suction. By having the moving means hold and pick up a DUT by suction, it is possible to reliably hold the DUT and streamline the structure of the electronic device test apparatus.

Preferably, the electronic device test apparatus is further provided with a test plate having substantially smooth holding surfaces for holding the other main surfaces of the DUTs where input/output terminals are not led out, the moving means places the DUTs on the holding surfaces of the test plate so as to relatively correspond to the array of the contact units, and the input/output terminals of the DUTs electrically contact the corresponding contact units of the test head in the state with the DUTs held by the holding surfaces of the test plate in a positional relationship corresponding to the array of the contact units.

In the present invention, instead of the test trays of the related art, a test plate having substantially smooth holding surfaces is employed and the flat holding surfaces are used to hold the main surfaces of the DUTs where input/output terminals of the DUTs are not led out, so the DUTs can be held without regard as to the outside shapes of the DUTs. Due to this, there is no longer a need to prepare test plates for specific types of DUTs, and exchange at the time of change of the types of devices is made unnecessary, so it becomes possible to handle a large number of types of DUTs very easily. Further, by having the holding surfaces of this test plate pick up the DUTs in the state corresponding to the array of contact units, in a memory IC test apparatus which has to secure a large simultaneous measureable number of devices, a large number of types of DUTs can be handled remarkably easily.

The holding surfaces of the test plate preferably have suction means for holding the other main-Surfaces of the DUTs by suction. By providing suction means at the holding surfaces of the test plate and using the suction means to hold the main surfaces of the DUTs where input/output terminals of the DUTs are not led out, it becomes possible to reliably hold the DUTs and possible to streamline the structure of the electronic device test apparatus to easily handle a large number of types of DUTs.

Further, the holding surfaces of the test plate preferably hold the DUTs in the state with the input/output terminals of the DUTs directed vertically upward. By having the holding surfaces of the test plate hold the DUTs in the state with the input/output terminals of the DUTs directed vertically upward, it is possible to make use of the action of gravity to stably hold the DUTs.

Preferably, the test plate has holders provided in a rockable manner and the holders are formed at the holding surfaces of the test plate. By providing the test plate with holders in a rockable manner and forming the holding surfaces for holding the DUTs at the holders, it is possible to absorbed error in contact due to mechanical bending or slanting of the test head and test plate, heat expansion/contraction due to thermal stress applied to the DUTs and so on.

Preferably, the contact units are provided with guide parts in their vicinities and the holders of the test plate are guided by the guide parts. By providing the contact units with guide parts in their vicinities and having the guide parts guide the holders at the time of contact, the DUTs can be accurately positioned with respect to the contact units relatively accurately.

Preferably, the guide parts have at least two guide surfaces extending in mutually nonparallel directions. By providing guide parts with guide surfaces extending in at least two directions nonparallel to each other and making the two guide surfaces abut against the holders of the test plate at the time of contact of the DUTs and contact units, the DUTs can be positioned with respect to the contact units relatively stably.

Preferably, the electronic device test apparatus has the moving means place the DUTs on the holders of the test plate after correcting the positions and postures of the DUTs so that the distances from the side surfaces of the holders abutting against the guide surfaces to the DUTs become substantially equal to the distances from the guide surfaces in the vicinities of the contact units to the contact units.

By having the moving means place the DUTs on the holders while correcting the positions and postures of the DUTs so that the distances from the side surfaces of the holders to the DUTs become substantially the same as the distances from the guide surfaces in the vicinities of the contact units to the contact units and, at the time of contact, making the side surfaces of the holders of the test plate abut against the guide surfaces in the vicinities of the contact units, it is possible to position the DUTs with respect to the contact units relatively accurately.

Preferably, further provision is made of pushing means for pushing the holders of the test plate so that the side surfaces of the holders abut against the guide surfaces.

By further providing the electronic device test apparatus with pushing means and using the pushing means to push the holders of the test plate against the guide parts of the contact units, the holders and guide parts can be made to closely contact each other and DUTs can be more precisely positioned with respect to the contact units.

Particularly preferably, the pushing means have elastic members and are provided at the test plate. For example, by providing pushing means having springs or other elastic members at the test plate, it is possible to streamline the structure of the electronic device test apparatus so as to more easily handle a large number of types of DUTs.

Preferably, the electronic device test apparatus is further provided with a positioning plate for positioning the holders of the test plate, and the moving means places the DUTs on the holders of the test plate while correcting their positions and postures in the state with the positioning plate positioning the holders of the test plate. More preferably, the positioning plate is formed so that the openings in which holders of the test plate can be inserted correspond to the array of contact units of the test head, and the moving means places the DUTs at the holders of the test plate while correcting their positions and postures in the state with the side surfaces of the holders of the test plate abutting against the inside walls of the openings of the positioning plate.

By using the positioning plate for positioning the holders of the test plate so as to position and constrain the holders when placing the DUTs at the holders, the relative positional relationships between the holders provided on the test plate in a rockable manner are defined, so the efficiency of the work of the moving means moving the DUTs can be improved.

Preferably, the pushing means push the holders of the test plate so that the side surfaces of the holders of the test plate abut against the inside walls of the openings of the positioning plate. By having the pushing means used for making the holders of the test plate abut against the guide parts of the contact units make the holders of the test plate abut against the inside walls of the openings of the positioning plate when inserting the holders of the test plate into the openings of the positioning plate, the holders can be made to closely contact the inside walls of the openings and the DUTs can be positioned with respect to the contact units relatively more accurately.

Preferably, the moving means can move the picked up DUTs in any direction and can rotate them in any direction. By this, when placing the DUTs on the holding surfaces of the test plate, it is possible to place the DUTs in the desired position and desired posture at the holding surfaces.

To achieve this object, according to a second aspect of the present invention, there is provided a method of testing DUTs pushing their input/output terminals against contact units of a test head, comprising a first imaging step of capturing an image of one main surface of a DUT before the DUT is picked up by a moving means for picking up and moving DUTs, a second imaging step of capturing an image of another main surface of a DUT after being picked up by the moving means, an identifying step of calculating the position and posture of the DUT picked up by the moving means from the image information captured at the first imaging step and the second imaging step and identifying the relative position and posture of the DUT picked up by the moving means with respect to a contact unit based on the results of calculation, and a correcting step of having the moving means correct the position and posture of the DUT based on the relative position and posture of the DUT identified by the identifying steps.

More preferably, the identifying step comprises calculating the position and posture of the outside shape of the one main surface in the DUT before being picked up by the moving means and the position and posture of the input/output terminals of the DUT before being picked up by the moving means from image information captured at the first imaging step, calculating the position and posture of the outside shape of the other main surface in the DUT after being picked up by the moving means from image information captured at the second imaging step, and calculating the position and posture of the input/output terminals of the DUT after being picked up by the moving means based on the results of calculations.

In the present invention, before and after the moving means picks up a DUT, in the first and second imaging steps it captures images of the two main surfaces of the DUT, in the identifying step it calculates the position and posture of the uncapturable input/output terminals of the DUT after being picked up from the captured image information and it identifies the relative position and posture of the DUT with respect to the corresponding contact unit based on the results of calculation, and in the correcting step the moving means corrects the position and posture of the DUT based on the results of identification. Due to this, even when the IC move system picks up the surface of a DUT where input/output terminals are led out for move of the DUT along with use of the above test plate so as to facilitate handling of various types of DUTs, it becomes possible to judge the position and posture of the input/output terminals of the DUT after being picked up by the moving means, possible to position the DUT with respect to the corresponding contact unit with a high precision, and possible to prevent poor contact at the time of testing.

Alternatively, the method of testing an electronic device according to the present invention further comprises a third imaging step of capturing an image of the other main surface of the DUT before being picked up by the moving means, and the identifying step comprises calculating the position and posture of the input/output terminals of the DUT after being picked up by the moving means from the image information captured at the first imaging step, second imaging step, and third imaging step and identifying the relative position and posture of the DUT after being picked up by the moving means with respect to the contact unit based on the results of these calculations.

Further, preferably the identifying step comprises calculating the position and posture of the input/output terminals of the DUT before being picked up by the moving means from the image information captured at the first imaging step, calculating the position and posture of the outside shape of the other main surface of the DUT before being picked up by the moving means from the image information captured at the third imaging step, calculating the position and posture of the outside shape of the other main surface at the DUT picked up by the moving means from the image information captured at the second imaging step, and calculating the position and posture of the input/output terminals of the DUT picked up by the moving means based on the results of these calculations.

In the present invention, by providing the third imaging step of capturing the image of the other main surface of a DUT in the state before being picked up by the moving means and in the identifying step calculating the position and posture of the input/output terminals of the DUT picked up by the moving means considering that image information, even if variations in DUTs caused in the production process result in some differences in the outside shapes of the two main surfaces of the DUT, it is possible to accurately identify the relative position and posture of the DUT with respect to the corresponding contact unit.

BRIEF DESCRIPTION OF THE DRAWINGS

FIG. 9 is an overall plan view of a test head with an array of a plurality of contact units in an electronic device test apparatus shown in FIG. 1 and an enlarged view of a contact unit;

FIG. 25 is a view of the state of the IC move system successively placing IC chips at holders of a test plate;

FIG. 26 is a view of the state of IC chips held at the test plate being simultaneously pushed against contact units of the test head.

DESCRIPTION OF THE PREFERRED EMBODIMENTS

Below, embodiments of the present invention will be explained with reference to the drawings.

The electronic device test apparatus 1 of the present embodiment holds a plurality of (in the present embodiment, 64) IC chips (in FIG. 1 to FIG. 26, shown by notations "IC") on a test plate 110, conveys them to contact units 151 provided at a test head 150 for simultaneous testing in that state, and classifies the IC chips and stores them on predetermined trays according to the test results after the testing. It tests the devices under test, that is, the IC chips, in a state given thermal stress in a state of temperature higher than ordinary temperature (high temperature) or a state of temperature lower than ordinary temperature (low temperature).

Figure 1:
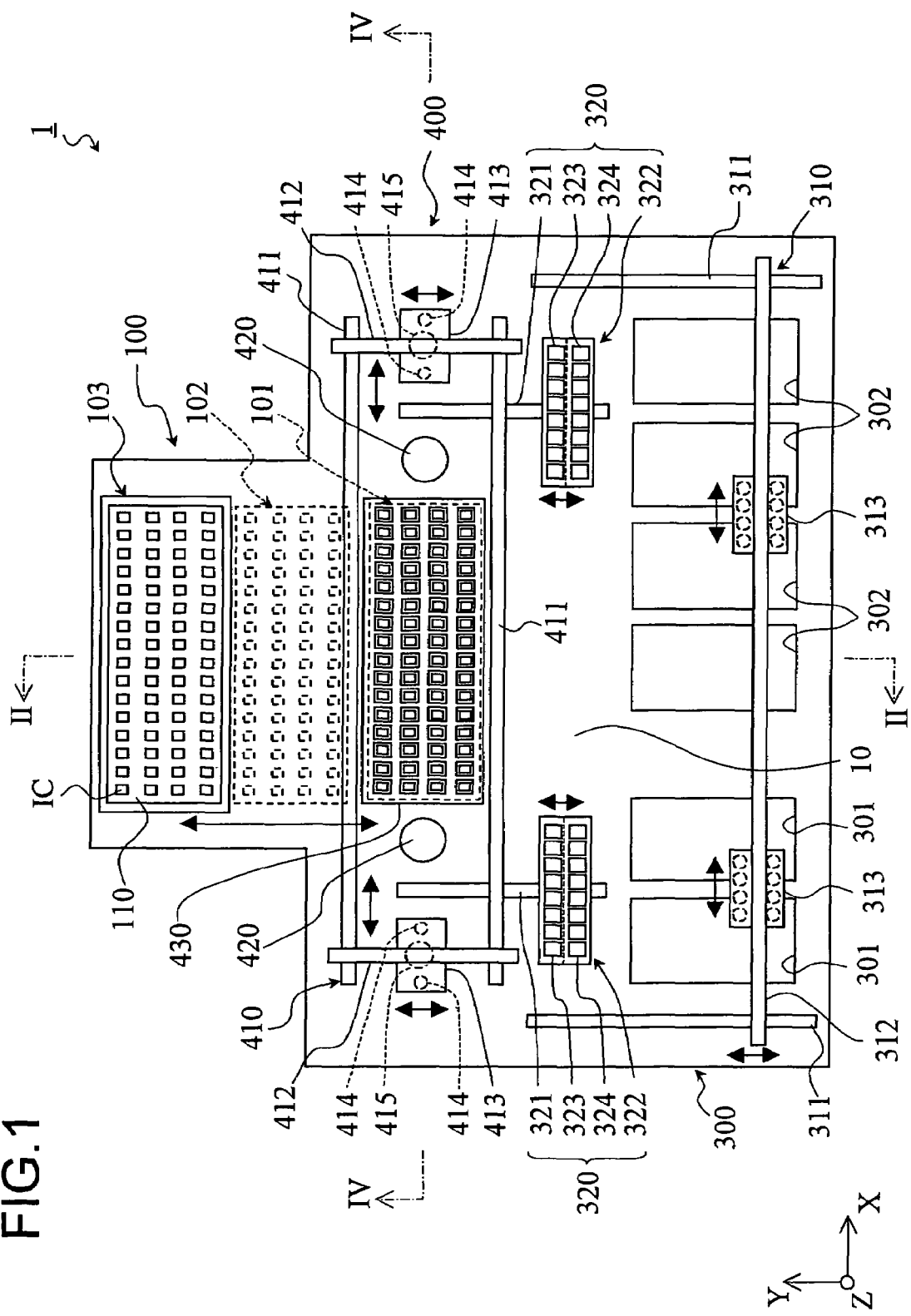
FIG. 1 is a schematic plan view of an electronic device test apparatus according to an embodiment of the present invention.
Figure 2:
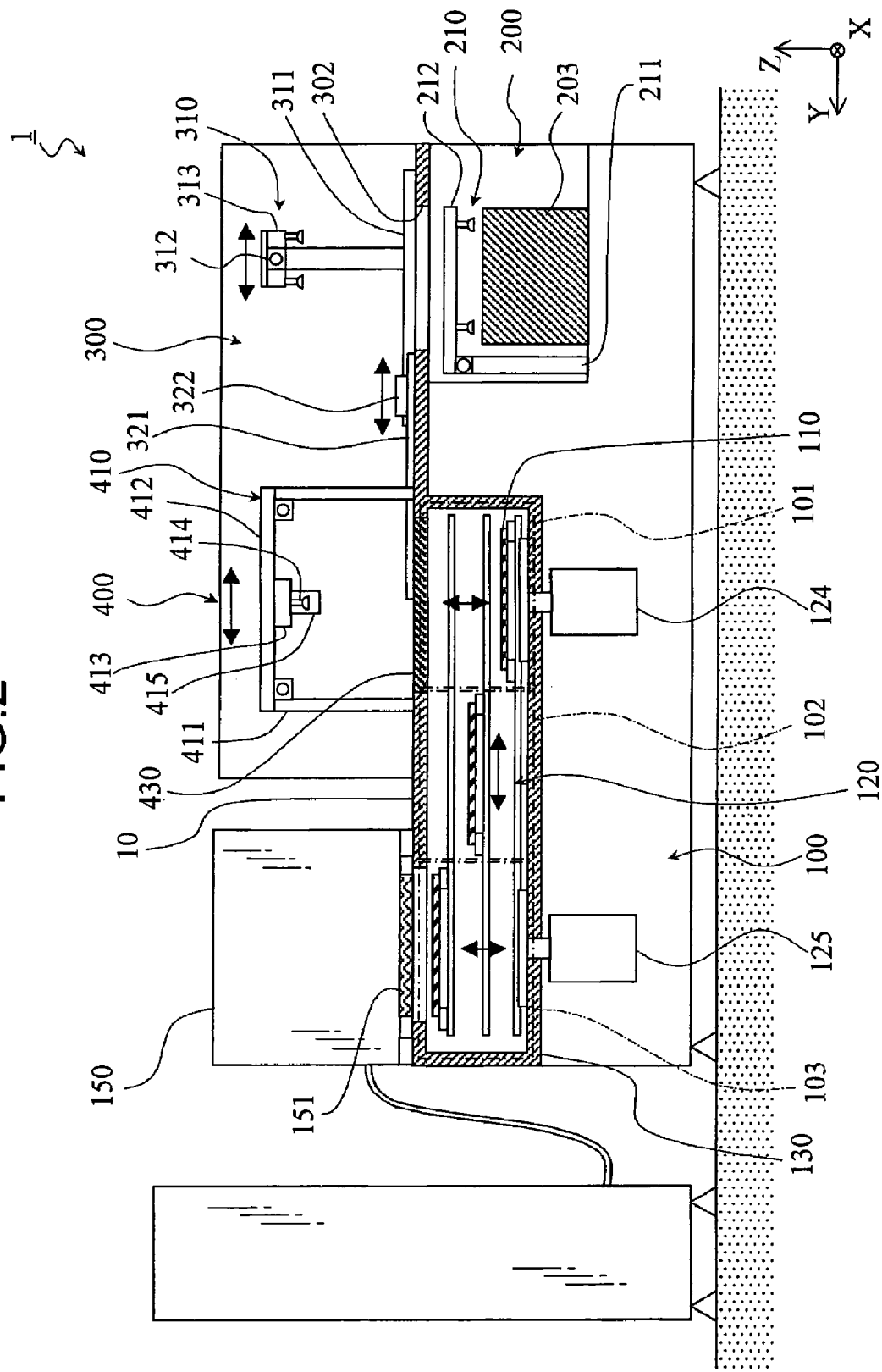
FIG. 2 is a schematic sectional view along the line II-II of FIG. 1.
Figure 3:
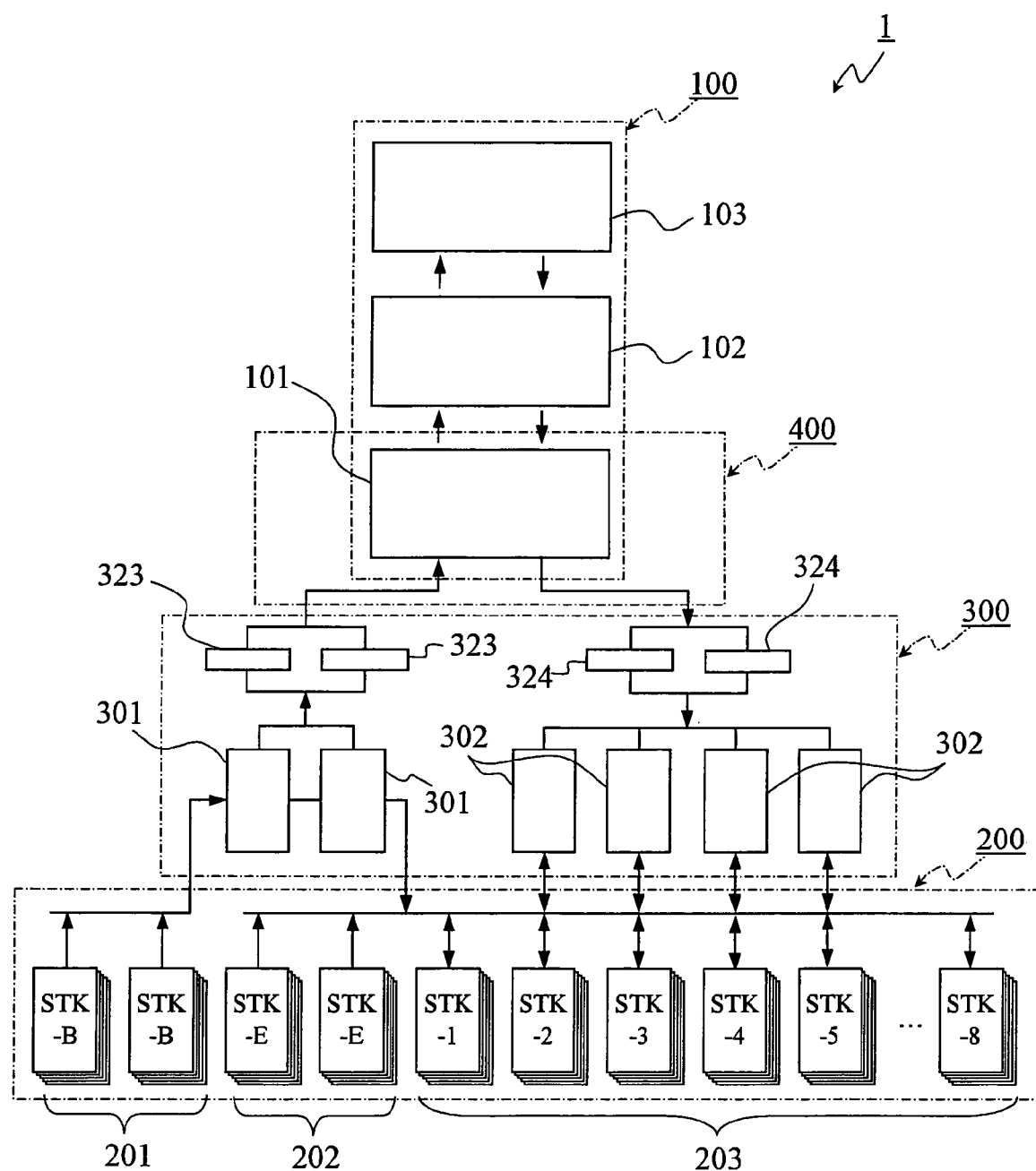
FIG. 3 is a conceptual view showing a path of conveyance of an IC chip in the electronic device test apparatus shown in FIG. 1.

As shown in FIG. 1, FIG. 2, and FIG. 3, the electronic device test apparatus 1 of the present embodiment is comprised of an IC stocker unit 200 for storing the IC chips to be test and classifying and storing the after-test IC chips, a loader/unloader unit 300 for feeding before-test IC chips supplied from the IC stocker unit 200 into an alignment unit 400 and classifying and ejecting after-test IC chips tested at a chamber unit 100 to the IC stocker unit 200, an alignment unit 400 for positioning IC chips, feeding the IC chips into the chamber unit 100, and ejecting after-test IC chips tested at the chamber unit to the loader/unloader unit 300, and a chamber unit 100 including a test head 150 and testing the IC chips in a state giving thermal stress to the IC chips.

Note that the IC stocker unit 200 is positioned below the system board 10, so is not illustrated in FIG. 1. Further, FIG. 3 is a conceptual view for furthering understanding of the method of transporting IC chips to be tested in the electronic device test apparatus of the present embodiment. Members actually arranged in the vertical direction are shown spread out in a planar fashion.

A large number of IC chips are placed on customer trays (not shown) before being placed into the electronic device test apparatus 1. They are supplied to the IC stocker unit 200 of the electronic device test apparatus 1 shown FIG. 2 and FIG. 3 in that state. IC chips are successively supplied from the customer trays in that IC stocker unit 200 by the loader/unloader unit 300 to the alignment unit 400. At that alignment unit 400, the IC chips are positioned relative to the contact units 151 of the test head 150 and successively placed in the holders 112 of a test plate 110 at a loading position 101 of the chamber unit 100. Further, this test plate 110 is transported to a stress position 102 where the IC chips are given high temperature or low temperature thermal stress in the state held on that test plate 110, then the test plate 110 is transported to a test position 103. Further, at that test position 103, the test head 150 simultaneously tests (inspects) the plurality of IC chips to determine if they are suitably operating). The IC chips are then classified in accordance with the test results. Below, the internal components of the electronic device test apparatus 1 will be described in detail.

IC Stocker Unit 200

The IC stocker unit 200 of this electronic device test apparatus 1, as shown in FIG. 2 and FIG. 3, is provided with before-test IC tray stockers 201 for stocking customer trays holding before-test IC chips, empty tray stockers 202 for stocking empty customer trays for holding after-test IC chips, after-test IC tray stockers 203 for stocking full customer trays carrying after-test IC chips, and a tray conveyor system 210 for transporting customer trays between the stockers 201-203.

In this IC stocker unit 200, before-test IC chips carried on the customer tray are supplied from the before-test IC tray stockers 201 to the loader/unloader unit 300 and after-test IC chips finished being tested by the test head 150 are ejected from the loader/unloader unit 300 to the after-test IC tray stockers 203 in accordance with the test results.

The before-test IC tray stockers 201 shown in FIG. 3 hold stacks of customer trays carrying IC chips to be tested with the trays. Further, the after-test IC tray stockers 203 hold stacks of customer trays carrying tested and classified IC chips. As opposed to this, the empty tray stockers 202 hold empty customer trays not carrying any IC chips.

Note that, in the present embodiment, in the chamber unit 100, the IC chips are tested with their input/output terminals HB directed vertically upward, so the before-test/after-test IC chips supplied/classified at this IC stocker unit 200 are carried on the customer trays in postures with the front surfaces from which their input/output terminals HB are led out (hereinafter also simply referred to as "the front surfaces of the IC chips", as opposed to which the back surfaces where their input/output terminals HB are not led out being hereinafter referred to as "the back surfaces of the IC chips") directed vertically upward and are therefore stored in that posture in the before-test IC tray stockers 201 and after-test IC tray stockers 203. Note that in this embodiment, the front surface of an IC chip corresponds to one main surface of the DUT in the present invention, while the back surface of the IC chipo corresponds to the other main surface of the DUT in the present invention.

The before-test IC tray stockers 201, empty tray stockers 202, and after-test IC tray stockers 203 are all of substantially the same structures, so, for example, the before-test IC tray stockers 201 or the empty tray stockers 202 can be used as after-test IC tray stockers 203 or vice versa. Therefore, in the test apparatus 1, the numbers of the stockers 201-203 can be easily changed in accordance with need.

As shown in FIG. 3, in this embodiment, two stockers STK-B are provided as before-test IC tray stocker 201. Next to the stockers STK-B, two stockers STK-E are provided as empty tray stockers 202. Next to those, further, eight stockers STK-1, STK-2, . . . , STK-8 are provided as after-test IC tray stocker 203 so as to be able to store ICs classified into as many as eight types in accordance with the test results. That is, in addition to good ICs and defective ICs, they can be classified into fast, medium, and slow speed ICs among the good ICs and ICs requiring retesting among the defective ICs.

The system board 10 of the electronic device test apparatus 1 above this IC stocker unit 200 is formed with two supply windows 301 at which customer trays carrying before-test IC chips are positioned and four eject windows 302 at which customer trays for carrying after-test IC chips are positioned. Below the windows 301, 302 ⊘„ elevator tables (not shown) are provided for raising and lowering the customer trays. At the supply windows 301, customer trays supplied from the before-test IC tray stockers 201 and carrying before-test IC chips are raised by the elevator tables and positioned in the region of the loader/unloader unit 300. As opposed to this, at the eject windows 302, empty customer trays supplied from the empty tray stocker 202 are raised by the elevator tables and positioned in the region of the loader/unloader unit 300. Further, as explained later, a first IC conveyor system 310 of the loader/unloader unit 300 supplies before-test IC chips from the customer trays positioned at the supply windows 301 to the loader/unloader unit 300 and ejects after-test IC chips to the customer trays positioned at the eject windows 302 from the loader/unloader unit 300.

The tray conveyor system 210 provided at this IC stocker unit 200, as shown in FIG. 2, is provided with an X-axial direction rail 211 provided along the X-axial direction and a movable head 212 having a Z-axial direction actuator (not shown) able to slide along that X-axial direction rail 211 in the X-axial direction and able to raise and lower suction pads attached to its bottom end in the Z-axial direction.

This tray conveyor system 210 conveys customer trays carrying before-test IC chips from the before-test IC tray stockers 201 to the elevator tables provided below the supply windows 301, conveys emptied customer trays from which all of the before-test IC chips have been unloaded at the supply windows 301 to the empty tray stockers 202, conveys them from those empty tray stockers 202 to elevator tables provided below the eject windows 302, classifies and conveys the customer trays filled with after-test IC chips at the eject windows 302 in the after-test IC tray stockers 203 in accordance with the test results and thereby circulates the customer trays in the IC stocker unit 200.

Loader/Unloader Unit 300

The loader/unloader unit 300 of this electronic device test apparatus 1, as shown in FIG. 1, FIG. 2, and FIG. 3, is provided with a first IC conveyor system 310 for successively conveying before-test/after-test IC chips between customer trays positioned at the windows 301, 302 and second IC conveyor systems 320 positioned in the region of the loader/unloader unit 300 and two IC conveyor systems 320 for conveying before-test/after-test IC chips between the region of the loader/unloader unit 300 and the region of the alignment unit 400.

In this loader/unloader unit 300, before-test IC chips are supplied from the IC stocker unit 200 to the alignment unit 400 and after-test IC chips finished being tested are ejected from the alignment unit 400 to the IC stocker unit 200.

The first IC conveyor system 310 provided at this loader/unloader unit 300, as shown in FIG. 1 and FIG. 2, is provided with two Y-axial direction rails 311 laid on the system board 10, a movable arm 312 able to reciprocate between the windows 301, 302 and second IC conveyor systems 320 by these two rails 311, and two movable heads 313 supported by this movable arm 312 and able to reciprocate along the movable arm 312 in the X-axial direction independently from each other. It operates in a range including the supply windows 301, the eject windows 302 and the two second IC conveyor systems 320 in the region of the loader/unloader unit 300.

Each movable head 313 of this first IC conveyor system 310 is provided with a plurality of suction pads facing downward and able to be raised and lowered in the Z-axial direction by a Z-axial direction actuator (not shown). The movable heads 313 pick up the before-test IC chips at the front surfaces by sucking air by their suction pads and then move so as to convey the before-test IC chips from the customer trays positioned at the supply windows 301 to either of the second IC conveyor systems 320. Further, they pick up the after-test IC chips at the front surfaces and convey them from the second IC conveyor systems 320 to the customer trays positioned at one of the eject windows 302 in accordance with the test results. For example, eight of these suction pads are provided at each movable head 313, thereby enabling eight IC chips to be conveyed simultaneously.

Each of the two second IC conveyor systems 320 provided at this loader/unloader unit 300 is provided with a Y-axial direction rail 321 laid on the system board 10 and a movable head 322 able to reciprocate along this rail 321 in the Y-axial direction. They are provided so as to correspond to the two movable heads 413 of the IC move system 410 of the later explained alignment unit 400.

The movable head 322 of each second IC conveyor system 320 is provided with a supply holder 323 for holding before-test IC chips and an eject holder 324 for holding after-test IC chips. The supply holder 323 and eject holder 324 respectively have eight recesses with outwardly slanted edges and are designed to be able to hold eight IC chips under test. In general, IC chips carried on a customer tray greatly vary in position, but by forming recesses in the supply holder 323, when the movable head 313 of the first IC conveyor system 310 drops the before-test IC chips into the recesses, their slanted surfaces correct the dropped positions of the IC chips whereby the positions and postures are corrected so that the eight before-test IC chips are correctly set.

Further, the bottoms of the recesses of the eject holder 324 are provided with for example heaters (not shown) etc. so as to prevent condensation or dewing on the after-test IC chips when IC chips subjected to a low temperature inside the chamber unit 100 are ejected outside that chamber unit 100 and exposed to ordinary temperature.

Note that the holders 323 and 324 of the movable heads 322 of the second IC conveyor systems 320 need not have such recesses. Instead, for example, the holders 323, 324 may be given substantially smooth flat surfaces and be provided with suction nozzles opening to those flat surfaces for holding the IC chips or may be provided with suction nozzles at the bottoms of the recesses 323b.

In this way, in the present embodiment, by providing the first IC conveyor system 310 with two movable heads 313, for example, it is possible to have one movable head 313 pick up from before-test IC chips from a customer tray positioned at a supply window 301 and have the other movable head 313 classify and place after-test IC chips on to a customer tray positioned at an eject window 302, so the work times can be overlapped and the throughput of the electronic device test apparatus 1 can be improved.

Further, in the present embodiment, by providing two second IC conveyor systems 320, for example, it is possible to have one second IC conveyor system 320 be positioned in the region of the alignment unit 400 for positioning and loading work by the later explained IC move system 410 and have the other second IC conveyor system 320 be positioned in the region of the loader/unloader unit 300 for conveying work by the first IC conveyor system 310, so the work times can be overlapped and the throughput of the electronic device test apparatus 1 can be improved.

Alignment Unit 400

Figure 4:
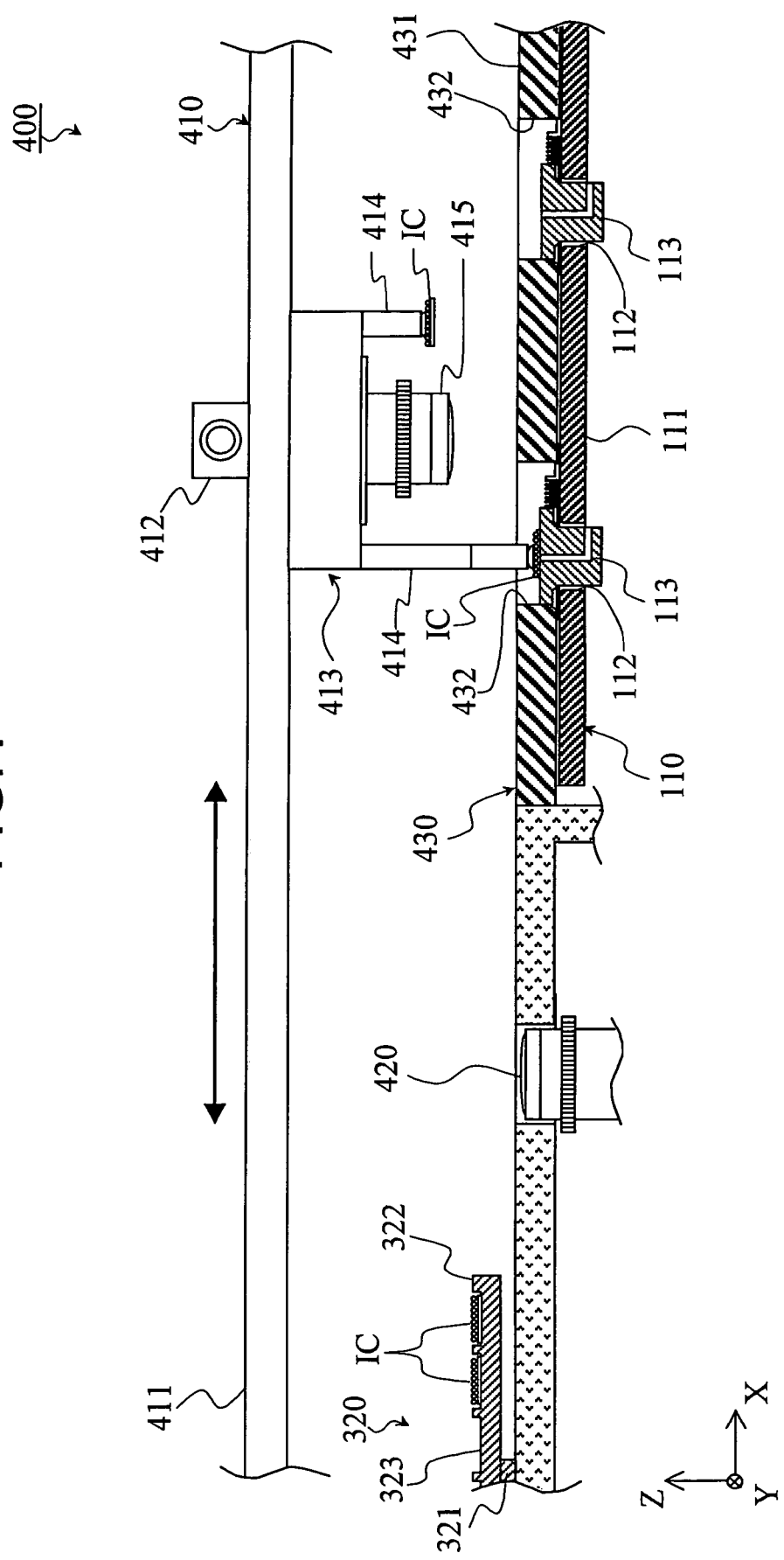
FIG. 4 is a sectional view of principal parts of an alignment unit along the line IV-IV of FIG. 1.

The alignment unit 400 of this electronic device test apparatus 1, as shown in FIG. 1, FIG. 2, and FIG. 4, is provided with an IC move system 410 (moving means) for moving before-test/after-test IC chips between the second IC conveyor system 320 positioned in the region of the alignment unit 400 and the test plate 110 in the chamber unit 100, two second cameras 420 (second imaging means) for capturing images of before-test IC chips in the state picked up by the IC move system 410, and a positioning plate 430 for positioning the holders 113 of the test plate 110 at which the IC move system 410 places the before-test IC chips.

In this alignment unit 400, before-test IC chips are moved from the second IC conveyor system 320 positioned in the region of the alignment unit 400 to the test plate 110 positioned at the loading position 101 of the chamber unit 100, the before-test IC chips are positioned during move, and the after-test IC chips finished being tested at the chamber unit 100 are moved from the test plate 110 to the second IC conveyor system 320 positioned in the region of the alignment unit 400.

The IC move system 410 provided at this alignment unit 400 is provided with two X-axial direction rails 411 laid on the system board 10, two movable arms 412 able to reciprocate along the two rails 411 mutually independently in the X-axial direction, and two movable heads 413 supported by the movable arms 412 and able to reciprocate along the movable arms 312 in the Y-axial direction. It operates in a region encompassing the second IC conveyor system 320 positioned in the region of the alignment unit 400 and the test plate 110 positioned at the loading position 101 of the chamber unit 100. Note that this IC move system 410 is controlled by the control device 416 shown in FIG. 5 so that the movable arms 412 do not interfer with each other on the rails 411.

Further, each movable head 413 of this IC move system 410 has pickup parts 414 for picking up the front surfaces of IC chips by suction pads provided at their bottom ends and for example a CCD camera or other first camera 415 (first imaging means) mounted at a posture with its optical axis directed vertically downward and able to capture the image of the front surfaces of the IC chips.

Further, each pickup part 414 of these movable heads 413 is able to rotate about the Z-axis by a motor etc. mutually independently from the others and is able to be raised or lowered by a Z-axial direction actuator (not shown) mutually independently from the others. Therefore, each movable arm 412 is able to position and move two before-test IC chips by a single reciprocating operation between the second IC conveyor system 320 and the test plate 110. Note that, in the present embodiment, the explanation was given of provision of two pickup parts 414 for one movable head 413 of the IC move system 410, but the present invention is not particularly limited to this. In accordance with the work time etc. required by that IC move system 410, it is also possible to provide one or three or more pickup parts 414 for one movable head 413.

In this way, in the present embodiment, by providing the IC move system 420 with two movable heads 413 able to move mutually independently, the positioning and move operation of IC chips can be executed mutually independently, so mutual worktimes can be overlapped and the throughput of the electronic device test apparatus 1 can be improved.

Note that, in the present embodiment, the IC move system 410 corresponds to one example of the moving means in the present invention. Therefore, the moving means in the present invention is designed to be able to pick up and release a DUT and to move the DUT in the X-, Y-, and Z-axial directions and further is designed to be able to make the DUT turn about the Z-axis. Due to this, when placing a DUT on the holding surface of the test plate, it is possible to position the DUT at the desired position and desired posture on that holding surface.

Each second camera 420 provided at this alignment unit 400 is, for example, a CCD camera and, as shown in FIG. 1 and FIG. 4, is embedded in the system board 10 between a second IC conveyor system 320 and the positioning plate 430 in a posture so that its optical axis is directed perpendicularly upward, and each second camera 420 can capture the image of the back surface of an IC chip in the state picked up by the IC move system 410.

Figure 5:
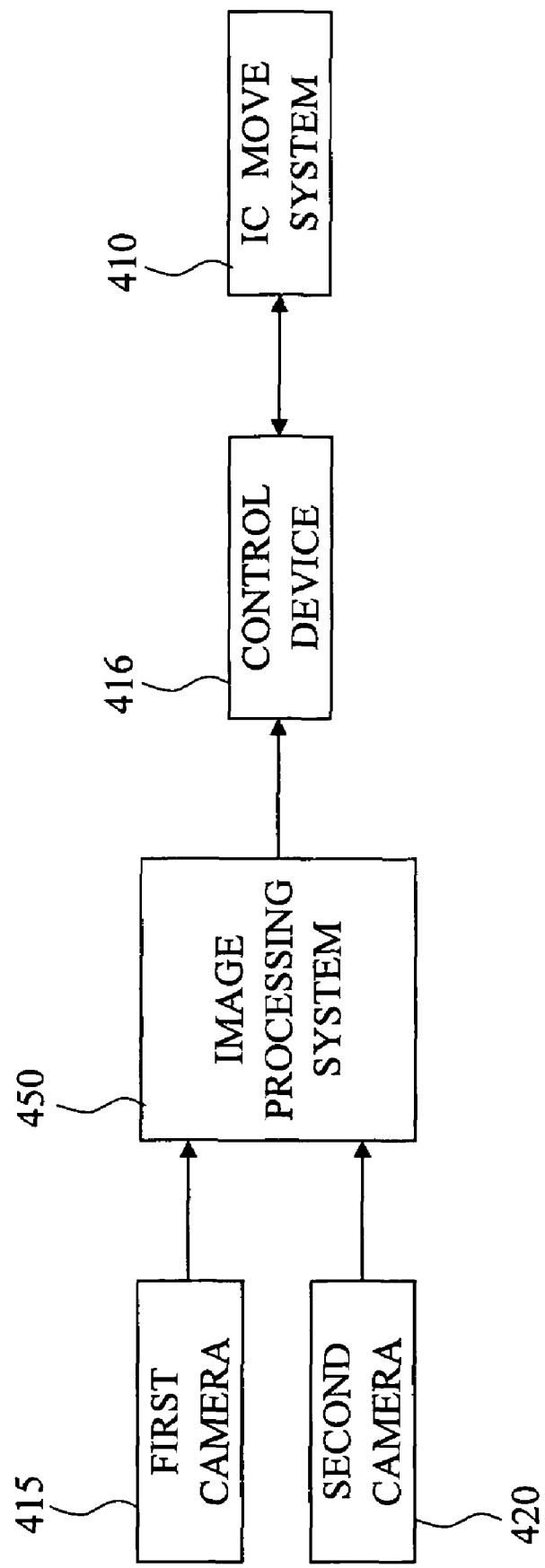
FIG. 5 is a block diagram of an image processing system and peripherals used for positioning IC chips in an electronic device test apparatus according to the embodiment of the present invention.

The second cameras 420 and the first cameras 415 provided at the movable heads 413 of the IC move system 410 are all, as shown in FIG. 5, connected to an image processing system 450 (identifying means) provided with for example an image processing processor etc. That image processing system 450 is connected to the control device 416 for controlling the operation of the IC move system 410. Note that by having the first cameras 415 and the second cameras 420 mutually capture images at the time of for example startup of the electronic device test apparatus 1, it is possible to correlate their coordinate systems on the images.

Figure 6:
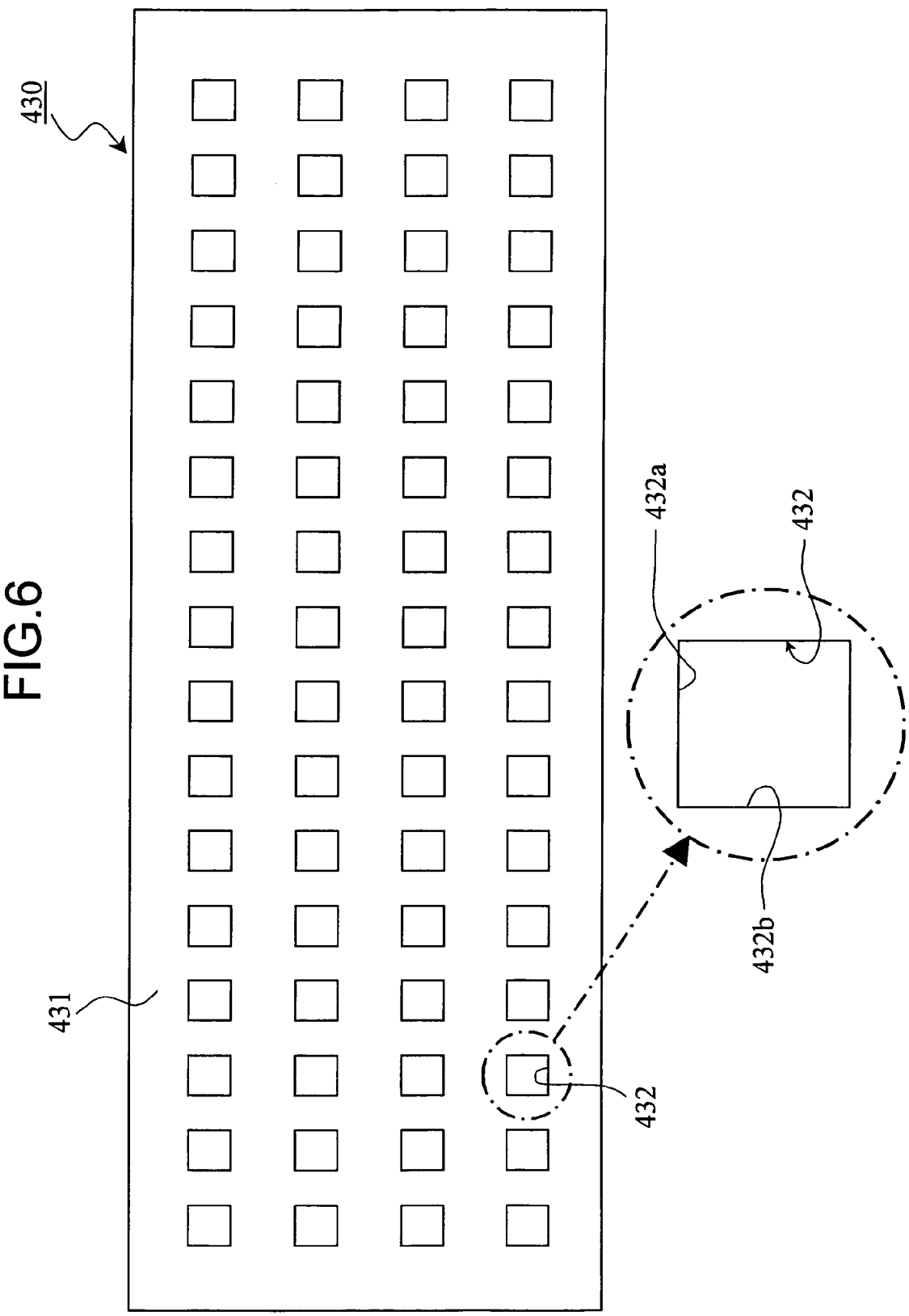
FIG. 6 is an overall plan view of a positioning plate of an electronic device test apparatus shown in FIG. 1 and an enlarged view of an opening.

The positioning plate 430 provided at this alignment unit 400, as shown in FIG. 6, is comprised of a substantially smooth flat plate body 431 formed with 64 openings 432 arranged in four rows and 16 columns passing through the plate body 431 in the thickness direction. As shown in FIG. 2 and FIG. 4, it is fixed to the system board 10 above the loading position 101 of the chamber unit 100.

Note that the relative positional relations of the openings 432 of this positioning plate 430, the contact units 151 of the test head 150, and the holders 113 of the test plate 110 will be explained in detail in the later explanation of the chamber unit 100, but the openings 432 of the positioning plate 430 have sizes enabling insertion of the holders 113 of the test plate 110. When the IC move system 410 loads before-test IC chips on the test plate 110, that test plate 110 is positioned at the loading position 101 in the chamber unit 100 and rises to contact the back surface of the positioning plate 430 whereby the holders 113 of the test plate 110 are inserted into the corresponding openings 432 of the positioning plate 430. Further, the openings 432 of the positioning plate 430 are arranged corresponding to the array of the contact units 151 of the test head 150.

In the positioning and move operation of a before-test IC chip in this alignment unit 400, first, a movable head 413 of the IC move system 410 is moved above the IC chip conveyed into the region of the alignment unit 400 by the second IC conveyor system 320, the first camera 415 provided at the movable head 413 captures the image of the front surface of the before-test IC chip, then the movable head 413 picks up the IC chip and moves it over the second camera 420, whereupon the second camera 420 captures an image of that IC chip.

Further, the image processing system 450 extracts the position and posture of the outside shape of the IC chip before being picked up by the movable head 414 and the position and posture of the input/output terminals HB of the IC chip before being picked up from the image information captured by the first camera 415 and, based on the extraction results, calculates the relative position and posture of the input/output terminals HB with respect to the outside shape of the IC chip before being picked up. At this time, the image processing system 450 extracts the position & posture of the outside shape of the IC chip and the position & posture of the input/output terminals HB based on the first coodinate system uniquely possessed by the first camera 415 itself.

Next, the image processing system 450 extracts the position and posture of the outside shape of that IC chip in the state picked up by the movable head 414 from the image information captured by the second camera 420. At this time, the image processing system 450 extracts the position and posture of the outside shape of the IC chip based on the second coordinate system uniquely possessed by the second camera 420 itself.

Next, the image processing system 450 judges the position and posture of the input/output terminals HB of the IC chip in the state picked up by the movable head 413 from these calculated results. At this time, as explained above, the first coordinate system of the first camera 415 and the second coordinate system of the second camera 420 are correlated with each other, for example, when starting up the electronic device test apparatus 1, so it is possible to calculate the position and posture of the input/output terminals HB in the state gripped by the movable head 414 from the position and posture of the outside shape of the IC chip and the input/output terminals HB extracted based on the unique coordinate systems of the cameras 415, 420.

In this way, in this embodiment, by judging the position and posture of the input/output terminals in the state picked up by the IC move system from the image information captured by the first camera and second camera, when the IC move system holds the front surface of a IC chip and moves the IC chip to facilitate handling of various types of IC chips, even if the IC move system is interposed between the input/output terminals of the IC chip and the first camera and the image of the position and posture of the input/output terminals of the IC chip in the state picked up by the IC move system cannot be captured, the IC chip can be positioned with a high precision by image processing.

Next, the movable head 413 is moved so that the first camera 415 is positioned above a holder 113 of the test plate 110, then the first camera 415 captures an image of the holding surface 114 of the test plate 110 carrying the IC chip. Further, the image processing system 450 extracts the position and posture of the holding surface 114 from the image information captured by the first camera 415, calculates the correction amount so that the center position $P_y$ of that holding surface 114 and the center of gravity position PH of the input/output terminals HB of the IC chip will substantially match and the posture of the holding surface 114 and the posture of the input/output terminal HB of the IC chip will substantially match. Based on that correction amount, the movable head 413 positions and places the IC chip at the holder. Note that details of the positioning technique using this image processing system 450 will be explained in detail later.

By the high precision positioning of IC chips by this image processing, it is possible to prevent not only offset in position of IC chips arising due to pickup and move by the IC move system in the test process, but also poor contact due to variations in the relative positions of the input/output terminals with respect to the outside shapes of the IC chips arising in the production process.

Note that in the above alignment unit 400, the explanation was given of extracting both the position & posture of the outside shape of an IC chip and the position and posture of the input/output terminals HB from the image information captured by the first camera 415, but as a second embodiment of the alignment unit 400, it is also possible to provide a new third camera 440 and extract the position & posture of the outside shape of an IC chip from the image information of that third camera 440.

Figure 7:
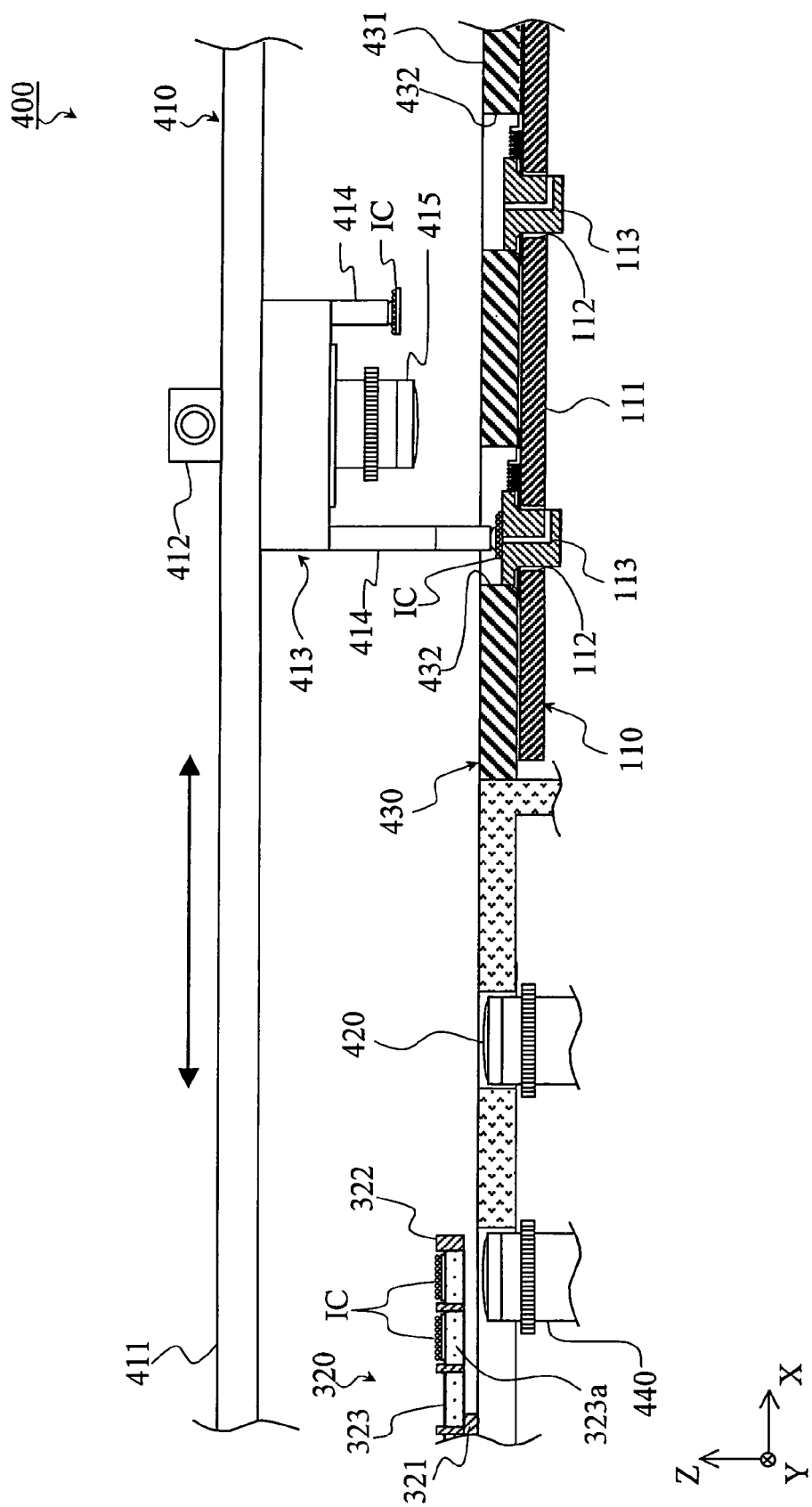
FIG. 7 is a sectional view of principal parts of an alignment unit according to another embodiment of the present invention.

More specifically, as shown in FIG. 7, in this embodiment, for example, a CCD camera or other third camera 440 is embedded in the system board 10 below the second IC conveyor system 320 positioned in the region of the alignment unit 400 with a posture so that its optical axis is directed vertically upward. Further, to enable the third camera 440 to capture an image of the back surface of an IC chip, in the supply holder 323 of the second IC conveyor system 320, the holding surface 323a for holding the before-test IC chip is made of a transparent member. The image of the outside shape of the back surface of the IC chip held by the supply holder 323 of the second IC conveyor system 320 positioned in the region of the alignment unit 400 is captured by this third camera 440. Next, image processing system 450 extracts the position and posture of the outside shape of the IC chip in the state before being picked up by the IC move system 410 from the image information captured by this third camera 440. The image information captured by the first camera 415 is used only for extraction of the position and posture of the input/output terminals HB.

In this way, since the first camera 415 captures the image of the outside shape of the front surface of the IC chip at the supply holder 323 of the second IC conveyor system 320, it is possible to calculate the difference of the outside shape of the front surface and back surface, so it is possible to calculate with a high precision the position & posture of the input/output terminals HB of the IC chip picked up by the IC move system 410 from the image information of the position & posture of the outside shape of the back surface of the IC chip captured by the second camera 420 and the image information of the position & posture of the outside shape of front surface of the IC chip captured by the first camera 415 through the image information of the position & posture of the outside shape of the back surface of the IC chip captured by the third camera 440. As a result, higher precision positioning of the IC chip by image processing becomes possible.

Note that by having the third camera 440 and the first camera 415 mutually capture images at the time of for example startup of the electronic device test apparatus 1, it is possible to correlate their coordinate systems on images. Further, the position & posture of the outside shape of an IC and the position & posture of the input/output terminals HB are extracted based on the coordinate systems uniquely held by the first and third cameras 415, 440 themselves.

In this way, by having the third camera 440 capture the image of the back surface of an IC chip in the state before being picked up by the IC move system 410 and extracting the position & posture of the outside shape of the IC chip before being picked up from the image information captured by that third camera 440, even if variations in the IC chips arising in the production process etc. result in the outside shape of the front surface of an IC chip and the outside shape of a back surface differing, the image processing system 450 can accurately judge the position & posture of the input/output terminals HB of an IC chip after being picked up can be position it more precisely.

Chamber Unit 100

The chamber unit 100 of the electronic device test apparatus 1, as shown in FIG. 1, FIG. 2, FIG. 8A, and FIG. 8B, is provided with a test head 150 for testing the IC chips held on the test plate 110, a plate transport system 120 (plate transporting means) for transporting the test plate 110 from the loading position 101 below the alignment unit 400 through the stress position 102 where thermal stress is applied to the test position 103 below the test head 150, and a casing 130 covering and sealing the plate transport system 120 and applying thermal stress to the IC chips.

In this chamber unit 100, the large number of IC chips held on the holders 113 of the test plate 110 are subjected to thermal stress and the IC chips are simultaneously pushed against the contact units 151 of the test head 150 for testing.

Figure 10:
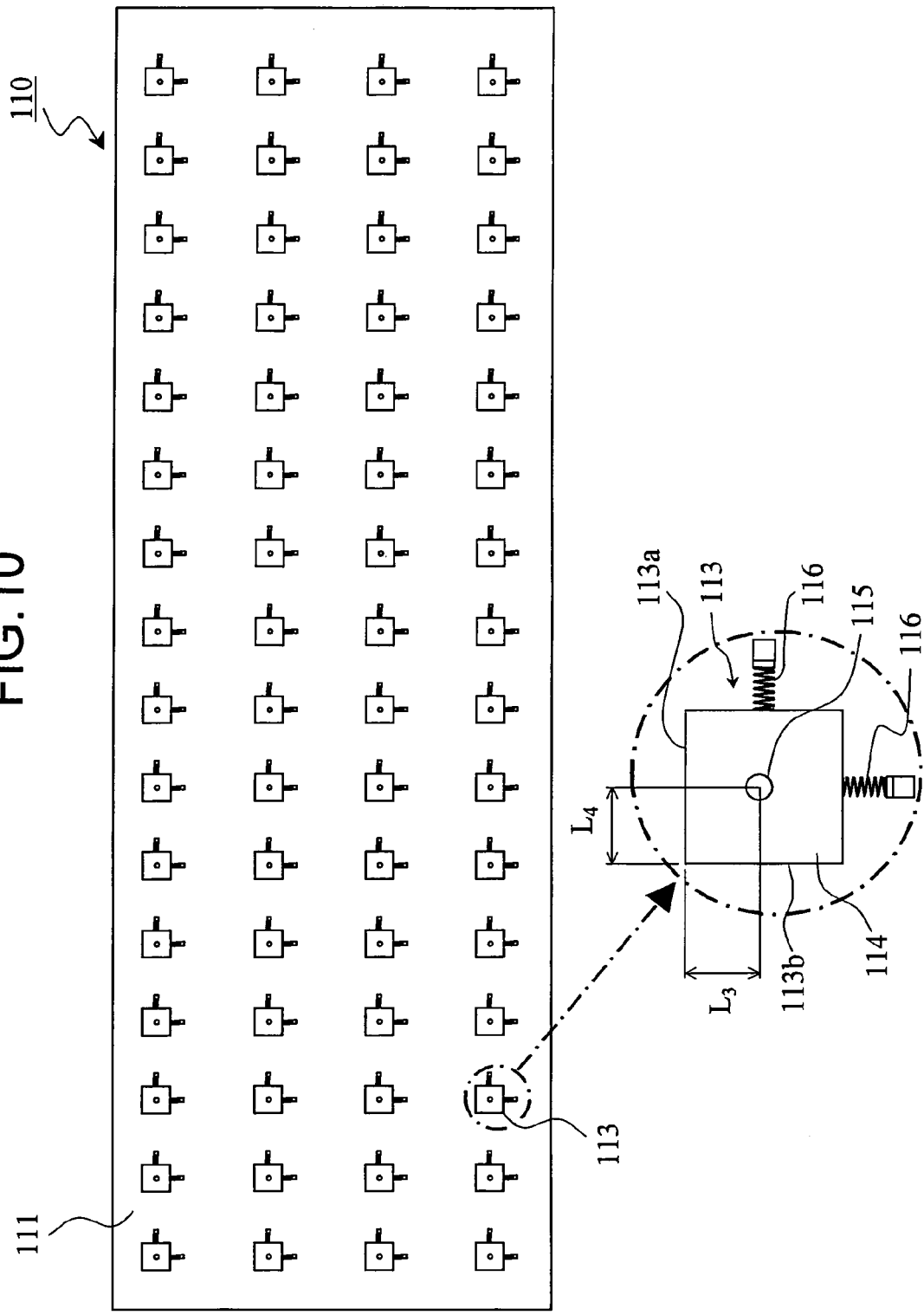
FIG. 10 is an overall plan view of a test plate in an electronic device test apparatus shown in FIG. 1 and an enlarged view of a holder.
Figure 11:
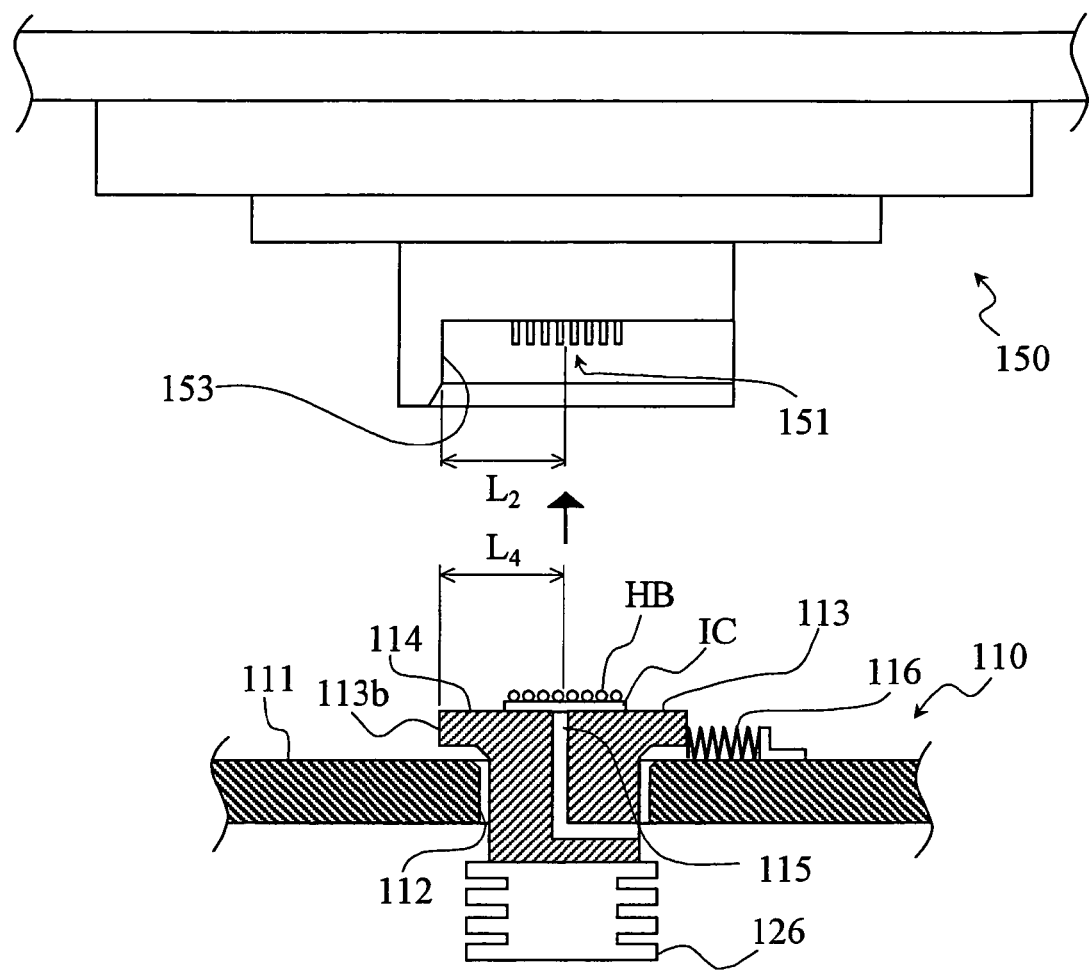
FIG. 11 is a view of the state before an IC chip held by a holder of the plate shown in FIG. 10 is pushed against the contact unit of the test head shown in FIG. 9.

The test head 150 contained in this chamber unit 100, as shown in FIG. 9, being provided with contact units 151 arranged in four rows and 16 columns, thereby enabling 64 ($=2^6$) IC chips to be tested simultaneously for improving the throughput of the electronic device test apparatus 1. Further, as shown in FIG. 10 and FIG. 11, each contact unit 151 of this test head 150 is provided in its vicinity with two guide surfaces 152, 153 extending so as to substantially perpendicularly intersect each other. As shown in the enlarged view of FIG. 9, the contact pins forming the contact units 151 arranged based on the first and second guide surfaces 152, 153 so that the center position of each contact unit 151 is positioned a distance $L_1$ from the first guide surface 152 and is positioned a distance $L_2$ from the second guide surface 153. This test head 150, at the time of a test, as shown in FIG. 1 and FIG. 2, is inverted above the test position 103 of the chamber unit 100, that is, is set to a posture so that the contact units 151 face perpendicularly downward.

As opposed to this, the test plate 110 circulating inside the chamber unit 100 is, as shown in FIG. 10, provided with 64 holders 113 for holding the IC chips in an array of four rows and 16 columns so as to match with the array of the contact units 151 so as to be able to simultaneously push 64 IC chips against the thus arranged contact units 151.

Each holder 113 of the test plate 110, as shown in FIG. 10 and FIG. 11, is formed with a holding surface 114 positioned at the top surface of the holder 113, comprised of a substantially smooth flat surface, on which is placed an IC chip by the IC move system 410, and first & second side surfaces 113a, 113b extending in directions substantially perpendicular to the holding surface 114 and in directions perpendicular to each other. The holding surface 114 is formed based on the first and second side surfaces 113a, 113b so that its center position is positioned a distance $L_3$ from the first side surface 113a and a distance $L_4$ from the second side surface 113b. The distances $L_3$ and $L_4$ are substantially the same as the distances $L_1$, $L_2$ from the first and second guide surfaces 152, 153 of the above test head 150 to the center position of the contact unit 151 ($L_1=L_3$, $L_2=L_4$). As shown in FIG. 11, at the time of testing, by making the first and second side surfaces 113a, 113b of the test plate 110 abut against the first and second guide surfaces 152, 153 of the test head 100 to guide them, the input/output terminals HB of the IC chip are mechanically positioned with respect to the contact pins forming the contact unit 151.

Further, this holding surface 114 is provided with a suction nozzle 115 at the substantial center, the suction nozzle 115 is able to hold the back surface of an IC chip. This holding surface 114 is formed larger than the back surface of all of the types of IC chips tested by the electronic device test apparatus 1. Note that instead of the suction nozzle 115 provided at the holding surface 114, for example, it is also possible to use double-sided tape, gel-like silicone, UV curable sticky tape used in semiconductor production processes, or other members having stickiness.

In this way, in the present embodiment, by making the holding surfaces for holding IC chips on the test plate for testing a plurality of IC chip in the held state be substantially smooth flat surfaces larger than the back surfaces of those IC chips and using these holding surfaces to hold the back surfaces of the IC chips where the input/output terminals are not led out, it is possible to use the same test plate for even different types of IC chips and work for changing test plates in accordance with the outside shapes of the IC chips becomes unnecessary, so it becomes possible to easily handle a large variety of IC chips.

As shown in FIG. 11, the plate body 111 of the test plate 110 is also formed with openings 112 having some clearance with respect to the outside diameters of the holders 113. The holders 113 are therefore inserted into the openings 112 and supported to be able to rock with respect to the plate body 111.

In this way, in the present embodiment, by making the holders 113 able to rock with respect to the plate body 111 in the test plate 110, it is possible to absorb error in contact due to mechanical blending or slanting of the test head 150 and test plate 110, heat expansion/contraction due to thermal stress in the chamber unit 100 and so on.

Further, as shown in the enlarged view of FIG. 10, the first side surface 113a and second side surface 113b are provided with springs 116 so as to impart predetermined pushing forces in directions substantially perpendicular to the facing two side surfaces. Note that instead of the springs 116, it is also possible to use for example other springs, rubber, elastomers, or other elastic members able to impart pushing forces to the holders 113.

Figure 8A:
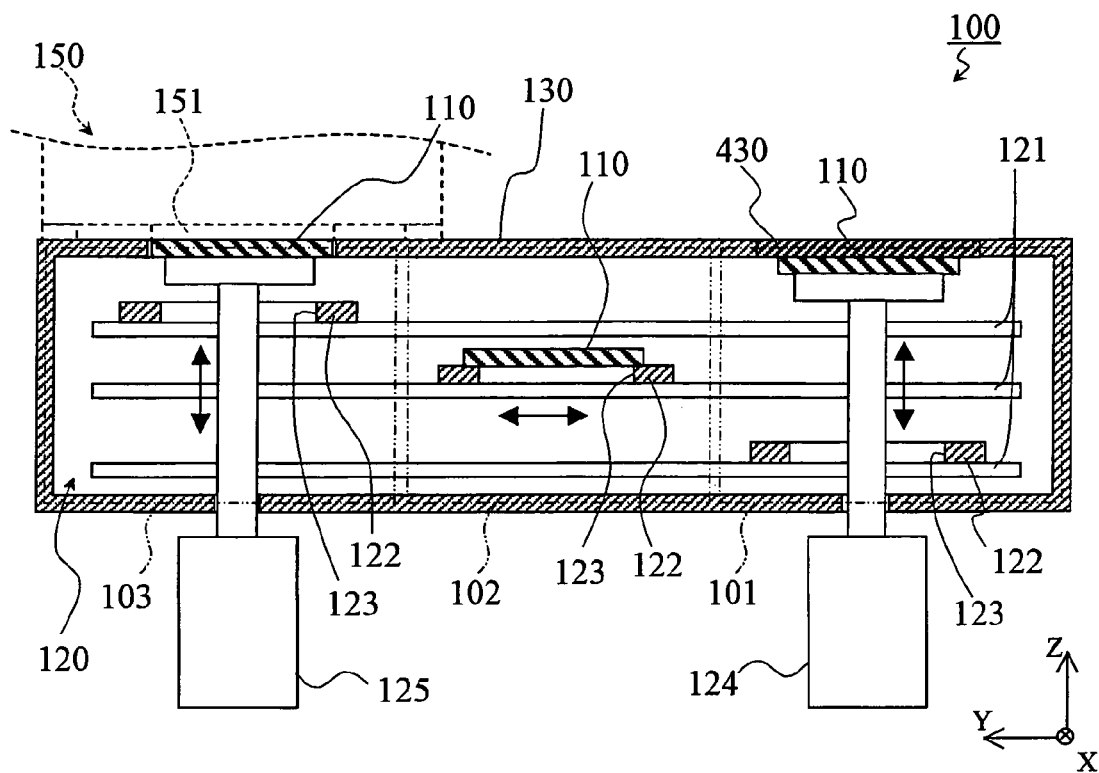
FIG. 8A is a sectional view of principal parts of a chamber unit along the line II-II of FIG. 1.
Figure 8B:
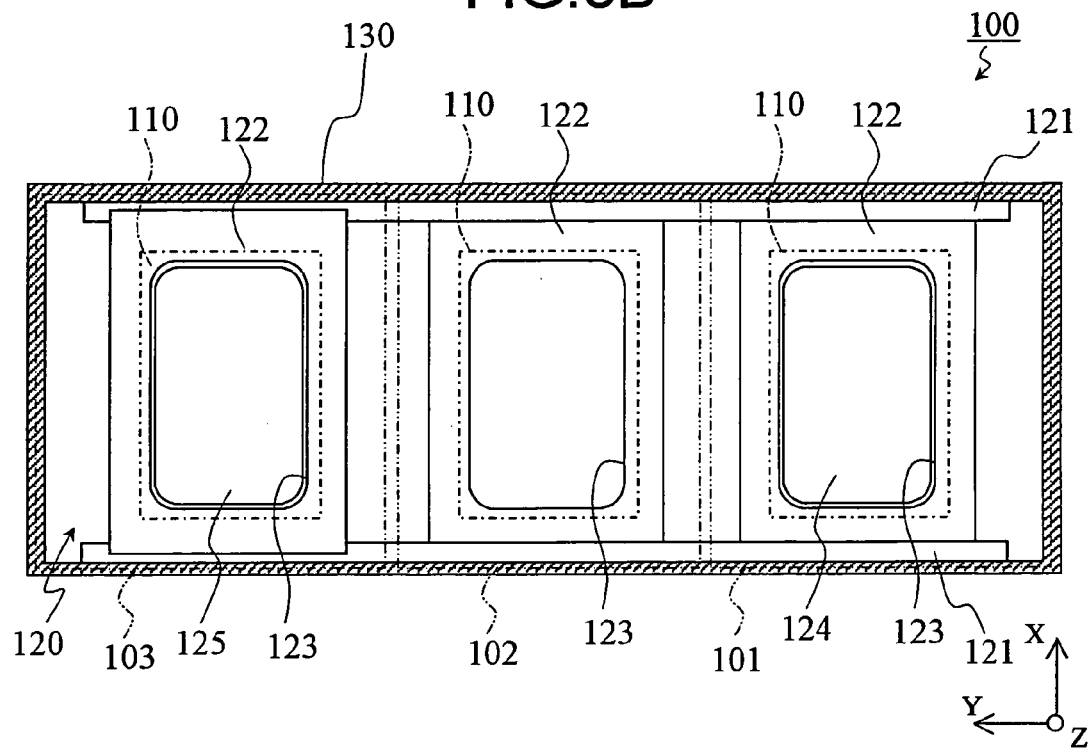
FIG. 8B is a sectional view of principal parts of a chamber unit in a direction perpendicular to FIG. 8A.

The plate transport system 120 provided at this chamber unit 100, as shown in FIG. 8A and FIG. 8B, is provided with three tiers of guide rails 121 arranged inside the chamber unit 100 along the Y-axial direction, three guide bases 122 able to reciprocate in the Y-axial direction on the guide rails 121 by Y-axial direction actuators (not shown) and holding test plates 110, an elevator mechanism 124 able to raise or lower a test plate 110 at the loading position 101 by a Z-axial direction actuator, and a pushing mechanism 125 able to push the IC chips against the contact units 151 at the test position 103 by a Z-axial direction actuator.

Each guide base 122 of this plate transport system 120 is formed with an opening 123 enabling insertion of the top end of the elevator mechanism 124 and the top end of the pushing mechanism 125. At the loading position 101 and test position 103, the elevator mechanism 124 and pushing mechanism 125 are able to rise and descend without interference with the guide base 122.

Further, the top part of the pushing mechanism 125 of this plate transport system 120 is provided pushers 126 corresponding to the array of holders 113 of the test plate 110, the pushers 126 push the IC chips against the contact units 151 by suitable pushing forces and have heater functions for maintaining the temperature of the ICs raised to a high temperature.

In this plate transport system 120, one test plate 110 is assigned for each tier of guide rail 121. For example, as shown in FIG. 8A, while the test plate 110 assigned to the topmost tier of guide rail 121 is being pushed against the contact units 151 for testing at the test position 103, the test plate 110 assigned to the center tier of guide rail 121 is positioned at the stress position 102 where the held IC chips are given thermal stress and the test plate 110 assigned to the bottom most tier of guide rail 121 is positioned at the loading position 101 where it is raised by the elevator mechanism 124 to enable loading/ejecting of before-test/after-test IC chips by the move system 410. Simultaneous execution of independent work for the different tier of guide rails 121 is therefore possible. Due to this, it is possible to overlap the loading time of the IC move system 410, the time of application of thermal stress, and the test time of the IC chips, so the throughput of the electronic device test apparatus 1 can be improved.

The casing 130 provided at this chamber unit 100 covers and seals the plate transport system 120 and enables thermal stress of −55 to 150° C. or so to be given to the IC chips. This casing 130 for example enables warm air to be blown into its sealed space or the bottom of a test plate 110 to be directly heated by a heater when applying a high temperature to the IC chips. As opposed to this, when applying a low temperature to the IC chips, for example, it enables liquid nitrogen to be circulated around the closed space to absorb heat from it.

Figure 12:
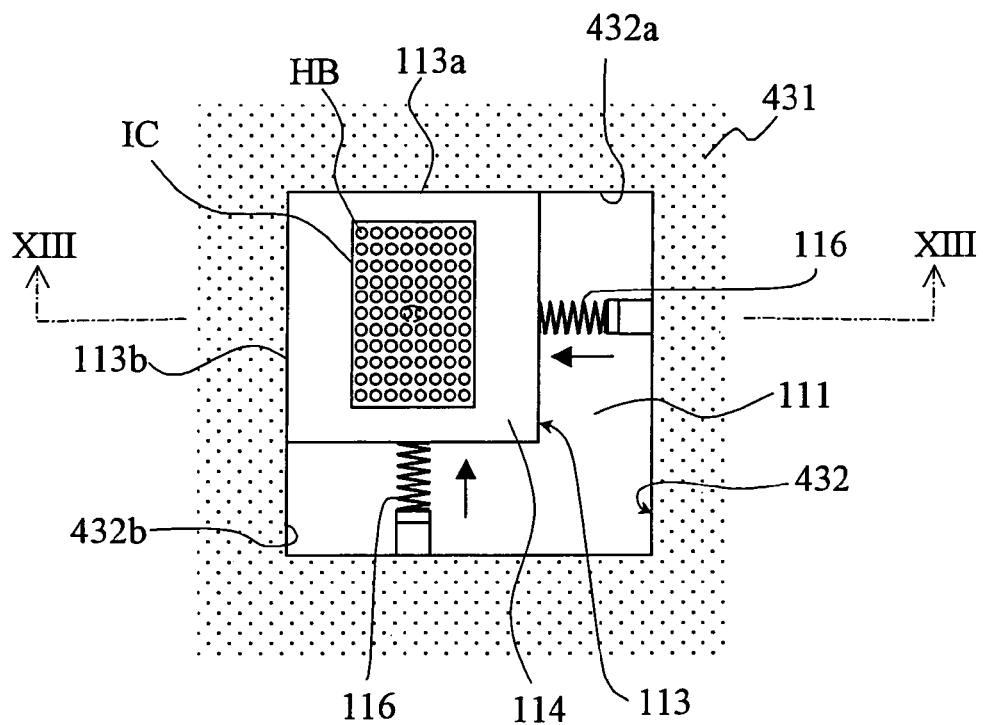
FIG. 12 is a plan view of the state where a holder of the test plate shown in FIG. 10 is inserted into an opening of the positioning plate shown in FIG. 6.
Figure 13:
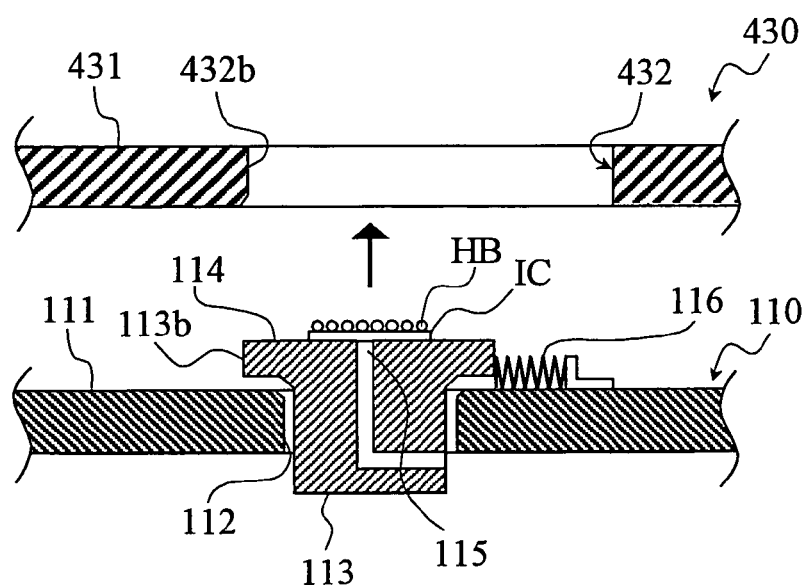
FIG. 13 is a sectional view along the line XIII-XIII of FIG. 12 showing the state before a holder of the test plate is inserted into an opening of the positioning plate.

In this chamber unit 100, first, a test plate 110 is positioned at the loading position 101 in the chamber unit 100 and is raised by the elevator mechanism 124 to contact the back surface of the positioning plate 430 so that the holders 113 of the test plate 110 are inserted into the corresponding openings 432 of the positioning plate 430. At the time of this insertion, as shown in FIG. 12 and FIG. 13, the first side surfaces 113a of the holders 113 abut against the first inside walls 432a of the openings 432 and the second side surfaces 113b of the holders 113 abut against the second inside wall surfaces 432b of the openings 432. Further, since springs 116 impact elastic forces in the abutting directions, these surfaces 113a, 113b, 432a, 432b closely contact each other, so the corresponding holders 113 of the test plate 110 are positioned and constrained with respect to the openings 432 of the positioning plate 430.

Further, after the IC chips are loaded at the holders 113 of the test plate 110 by the IC move system 410, the test plate 110 holding the IC chips at the holders 113 is lowered by the elevator mechanism 124 and transported along the corresponding tier of guide rail 121 to the stress position 102. At this stress position 102, after waiting a predetermined time, the IC chips are given the desired thermal stress, then the test plate 110 is transported to the test position 103 where it is raised by the pushing mechanism 125 and the IC chipos held at the holders 113 of the test plate 110 are simultaneously pushed against the corresponding contact units 151 of the test head 150 for testing.

At this time, by a similar procedure as with the operation where the side surfaces 113a, 113b of the holders 113 abut against the inside wall surfaces 432a, 432b of the openings 432, the first side surfaces 113a of the holders 113 of the test plate 110 abut against the first guide surfaces 152 in the vicinities of the contact units 151 and the second side surfaces 113b of the holders 113 of the test plate 110 abut against the second guide surfaces 153 in the vicinities of the contact units 151. Simultaneously with this, the springs 116 impart pushing forces in the abutting directions, so these surfaces 113a, 113b, 152, 153 come into close contact and the corresponding holders 113 of the test plate 110 are positioned with respect to the contact units 151 of the test head 150.

Here, as explained above, each IC chip on a test plate 110 is positioned by the IC move system 410 so that the center of gravity position PH and posture of its input/output terminals HB substantially match with the center position $P_v$ and posture of the holding surface 114. Further, the distances $L_1$, $L_2$ from the first and second guide surface 152, 153 to the center position of a contact unit 151 at the test head 150 and the distances $L_3$, $L_4$ from the first and second side surfaces 113a, 113b to the center position $P_v$ of a holding surface 114 at the test plate 110 are the same, so, as shown in FIG. 11, at the time of testing, high precision positioning of the input/output terminals HB of the IC chip with respect to the contact pins forming a contact unit 151 is achieved.

Further, in the present embodiment, by using image processing in advance for high precision positioning of the IC chips outside the chamber unit and by making the side surfaces of the holders of the test plate abut against the guide surfaces of the test head for mechanical positioning inside the chamber unit, it is possible to realize high precision positioning of IC chips using the image processing technique without placing CCD cameras etc. inside the chamber unit.

Further, in the present embodiment, in the test plate, the holders can rock with respect to the plate body, but at the time of loading of the IC chips by the IC move system, that holders are positioned and constrained by the positioning plate, so the relative positional relationships among the holders are defined and the relative positional relationships among the holding surfaces 114 can be unambiguously determined, so there is no longer a need to use the first camera to identify the holding surface each time an IC chip is loaded and therefore the speed of the move and positioning operations by the IC move system can be improved.

Next, the action of the electronic device test apparatus 1 according to the present embodiment will be explained in accordance with the flow chart of FIG. 14 and FIG. 15 to FIG. 26.

First, one movable head 313 of the first IC conveyor system 310 approaches a customer tray supplied from a before-test IC tray stocker 201 to a supply window 301. The suction pads provided at the bottom end of that movable head 313 simultaneously pick up and hold eight before-test IC chips. That movable head 313 is raised by a Z-axial direction actuator (not shown) in the Z-axial direction and slides along the movable arm 312 and Y-axial direction rail 311 to be transported to one of the second IC conveyor systems 320 positioned in the region of the loader/unloader unit 300 where the IC chips are transferred to the second IC conveyor system 320. The second IC conveyor system 320 holding the IC chips then moves the movable head 322 along the Y-axial direction rail 321 to the region of the alignment unit 400.

Figure 14:
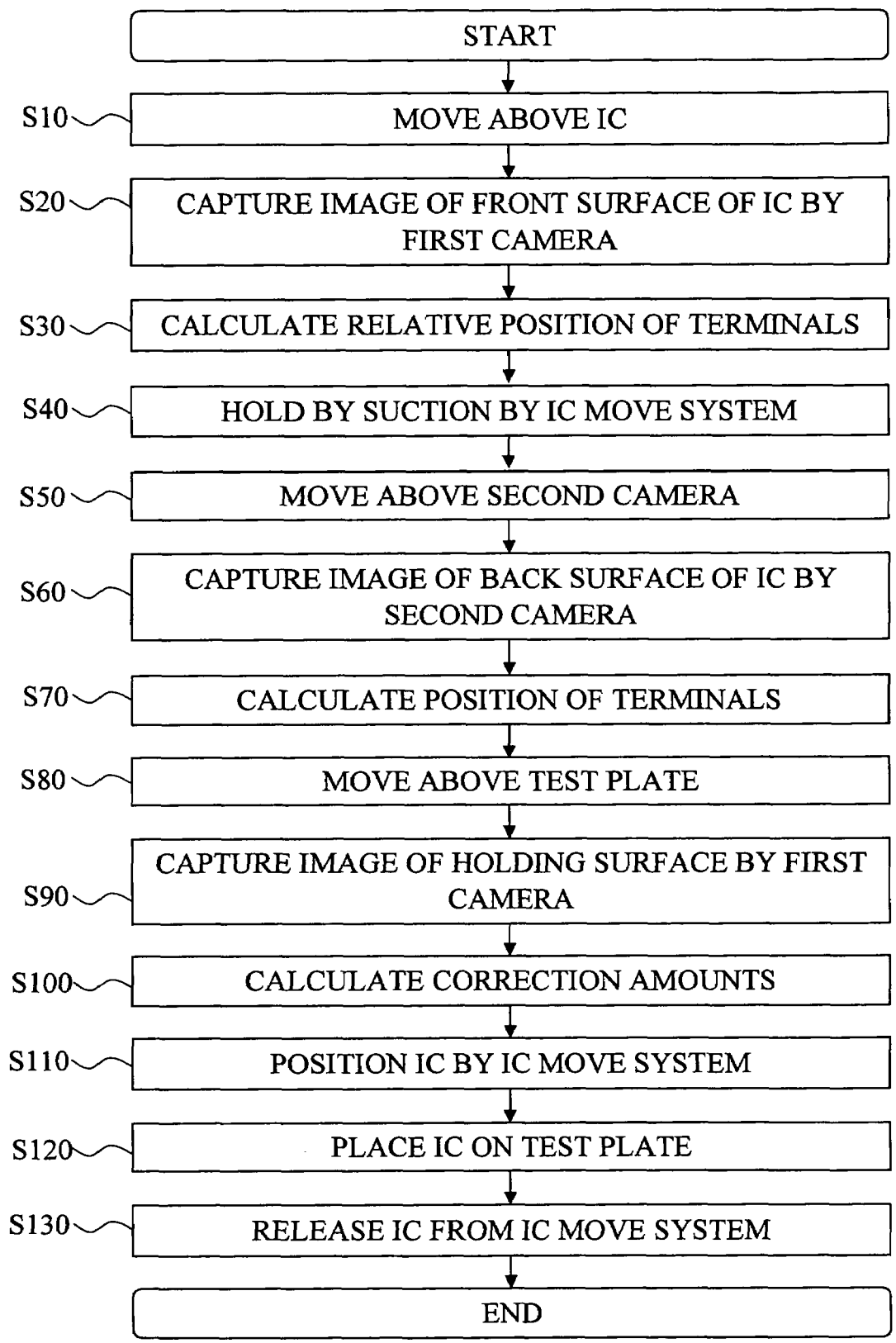
FIG. 14 is a flow chart of the routine for positioning an IC chip by an image processing system and IC move system.
Figure 15:
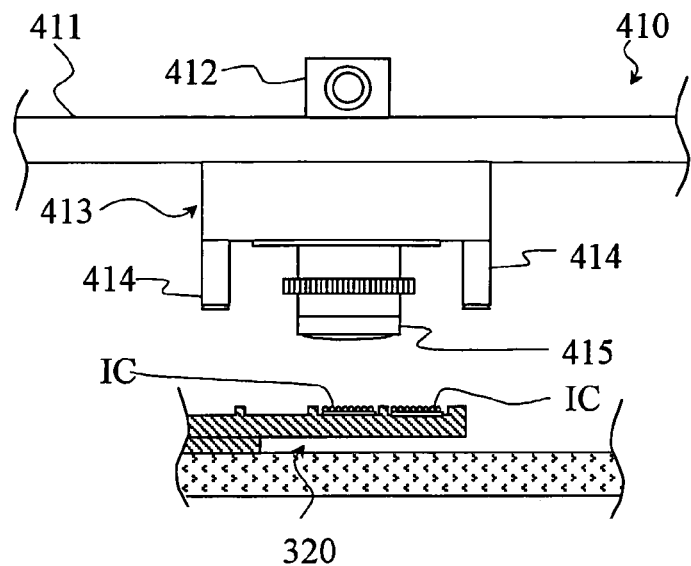
FIG. 15 is a view of the state of a first camera capturing an image of the front surface of an IC chip.

Next, as shown in FIG. 15, the movable head 413 of the IC move system 410 is moved so that the first camera 415 is positioned above the second IC conveyor system 320 moved into the region of the alignment unit 400 (step S10 of FIG. 14) whereupon the first camera 415 captures an image of the front surface of a IC chip (step S20).

Figure 16:
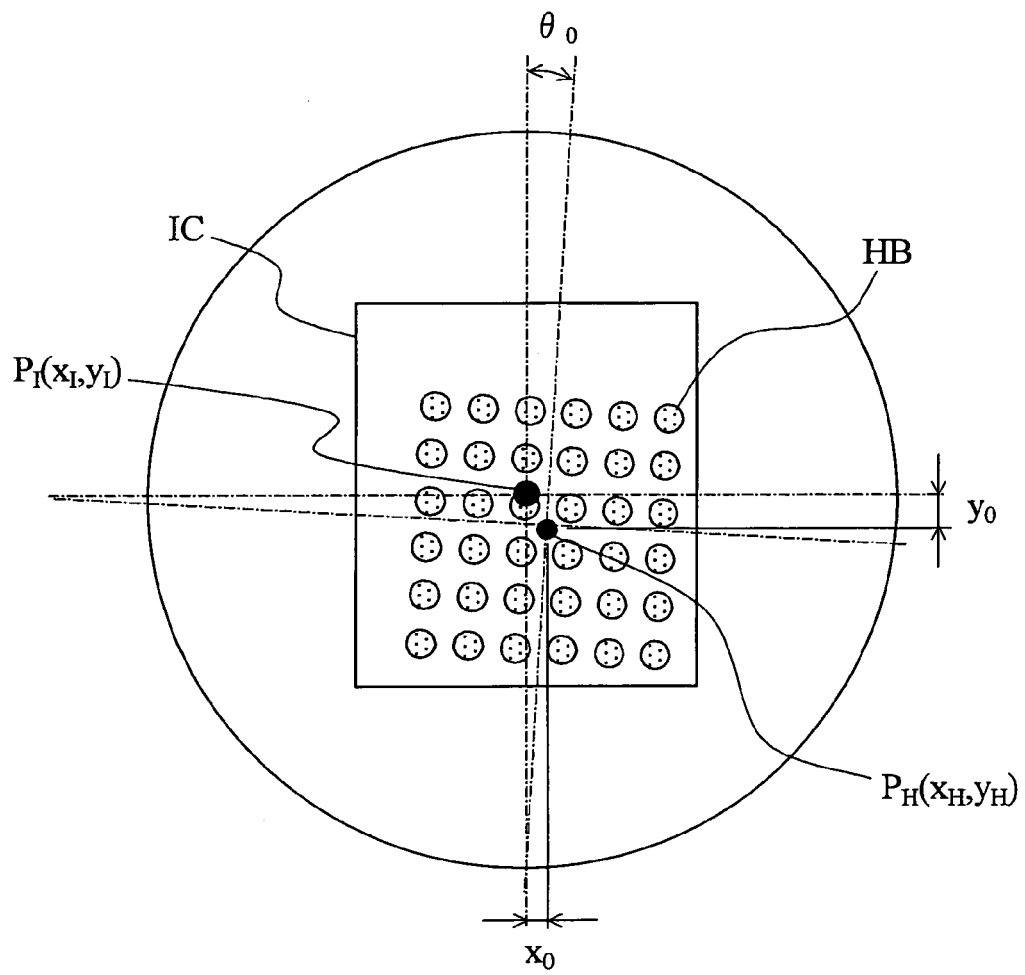
FIG. 16 is a view of the image captured by the first camera in FIG. 15.

Next, the image processing system 450 calculates the relative position and posture $(x_0, y_0, \theta_0)$ of the input/output terminals HB relative to the outside shape of the IC chip from this image information captured by the first camera 415 (step S30) as shown in FIG. 16.

As a specific method of calculating the relative position of the input/output terminals with respect to the outside shape of the IC chip, the image processing system 450 first fetches the image information captured by the first camera 415 and processes that image information by digitalization or other image processing techniques to extract the outside shape and input/output terminals HB of the IC chip. Next, based on the first coordinate system of the first camera 415, it calculates the coordinates $(x_1, y_1)$ of the center position $P_1$ of the outside shape extracted and the coordinates $(x_H, y_H)$ of the center of gravity position PH of the input/output terminals HB extracted and compares that center position $P_1$ and center of gravity position $P_H$ SO as to calculate the relative position $(x_0, y_0)$ of the input/output terminals HB with respect to the outside shape of the IC chip.

Further, as a specific method of calculation of the relative posture of the input/output terminals HB with respect to the outside shape of the IC chip, first, the image processing system 450 calculates an approximation line of a contour forming the outside shape of the IC chip extracted. Next, it extracts the regular rows formed by the extracted input/output terminals HB, calculates approximation lines passing through the centers of the input/output terminals HB forming the rows for each row, and further calculates an average line for that plurality of approximation lines. Next, the angle formed by the average line showing the posture of the input/output terminals HB with respect to the approximation line showing the posture of the outside shape of the IC chip is calculated to thereby calculate the relative posture $\theta_0$ of the input/output terminals HB with respect to the outside shape of the IC chip. Note that this relative position and posture $(x_0, y_0, \theta_0)$ of the input/output terminals HB with respect to the outside shape of the IC chip are due to variations in the IC chips arising in the production process of the IC chips.

Figure 17:
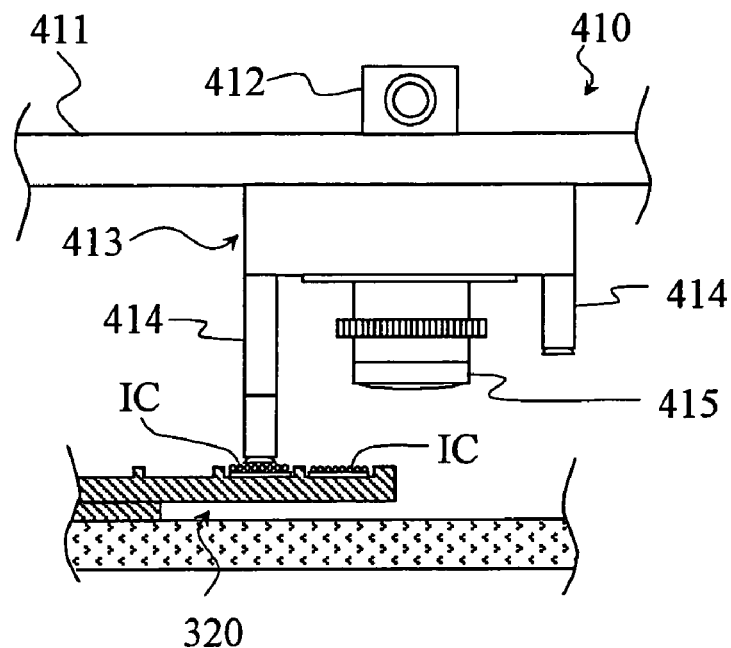
FIG. 17 is a view of the state of the IC move system picking up an IC chip.

Next, as shown in FIG. 17, one movable head 413 of the IC move system 410 picks up and holds an IC chip at its approximate center by a suction pad (step S40). Further, that movable head 414 repeats the operation from steps S10 to S40 for another IC chip held by the second IC conveyor system 320 positioned in the region of the alignment unit 400 so as to pick up another IC chip by the other pickup part 414.

Figure 18:
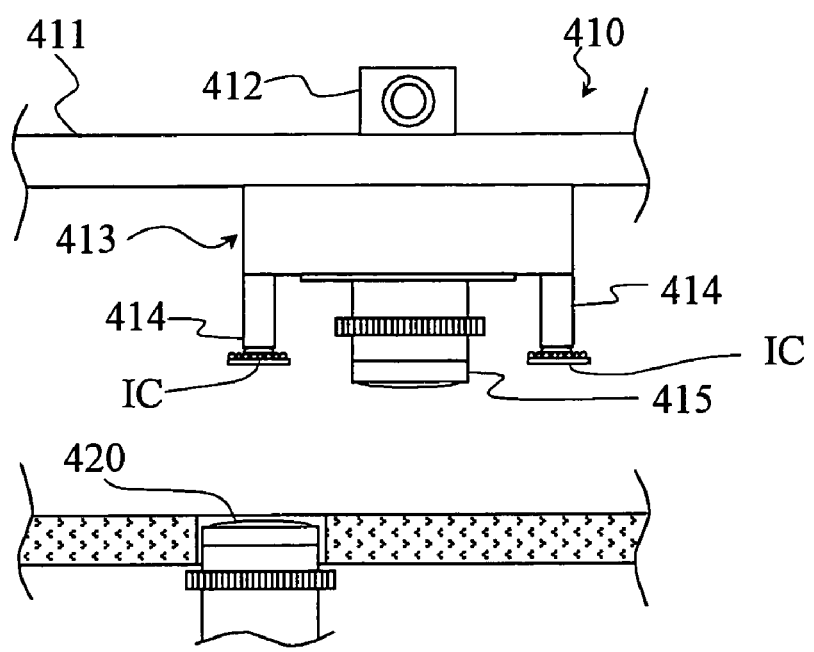
FIG. 18 is a view of the state of a second camera capturing an image of the back surface of an IC chip picked up by a moving means.

After each pickup part 414 picks up an IC chip, as shown in FIG. 18, the movable head 414 moves so that one IC chip is positioned above the second camera 420 (step S50), then the second camera 420 captures an image of the back surface of that IC chip in the state picked up by that movable head 414 (step S60).

Figure 19:
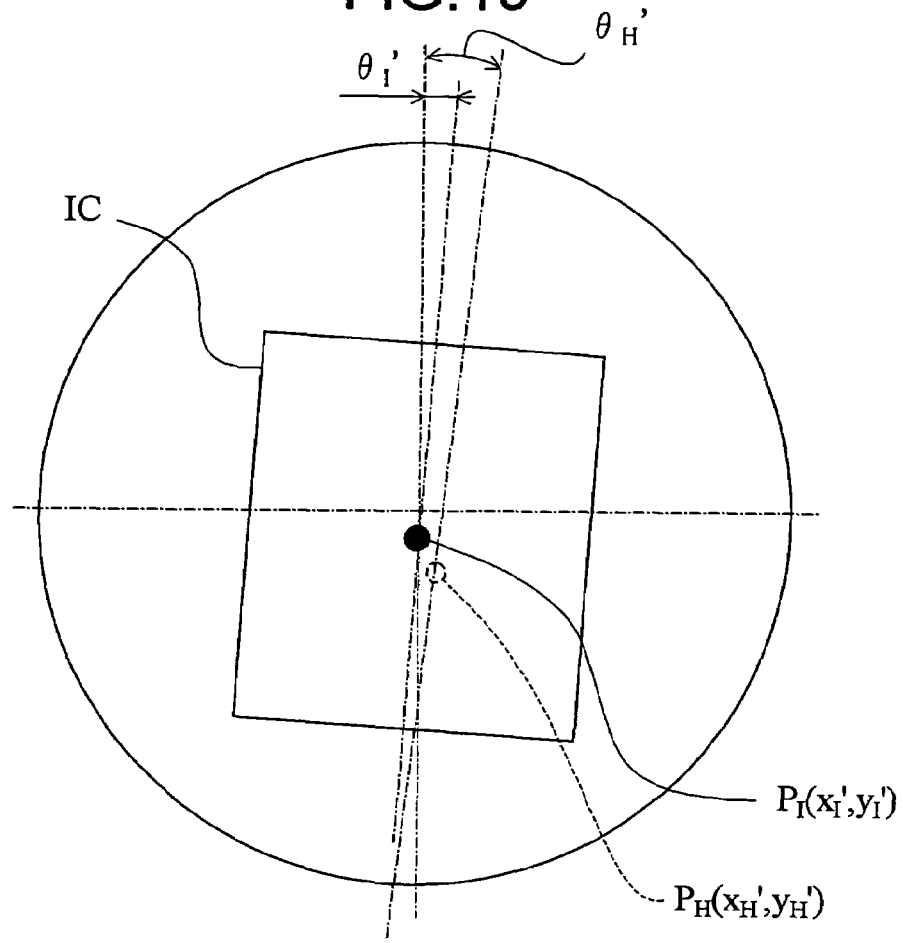
FIG. 19 is a view of an image captured by the second camera in FIG. 18.

Further, the image processing system 450 calculates the position and posture $(x_1', y_1', y_1')$ of the outside shape of the IC chip in the state held by the movable head 413 of the IC move system 410 from the image information captured by this second camera 420 based on the second coordinate system of the second camera 420 as shown in FIG. 19 and calculates the position and posture $(x_H', y_H', \theta_H')$ of the input/output terminals HB in the state picked up by the movable head 414 (step S70) from the relative position and posture $(x_0, y_0, \theta_0)$ of the input/output terminals HB with respect to the outside shape of the IC chip calculated at step S30 and the position and posture $(x_1', y_1', \theta_1')$ of the outside shape of the IC chip in the picked up state. At this time, as explained above, by having the first coordinate system of the first camera 415 and the second coordinate system of the second camera 420 correlated at the time of for example startup of the electronic device test apparatus 1, it is possible to calculate the position and posture of the input/output terminals HB in the state picked up by the movable head 414 from the position & posture of the outside shape and the input/output terminals HB of the IC chip extracted based on the coordinate systems unique to the cameras 415, 420.

Note that the differences in the images of the center position $P_1$ of an IC chip before and after being picked up by a movable head 414 are due mainly to offset arising at the time of pickup and move by the movable head 414.

Figure 20:
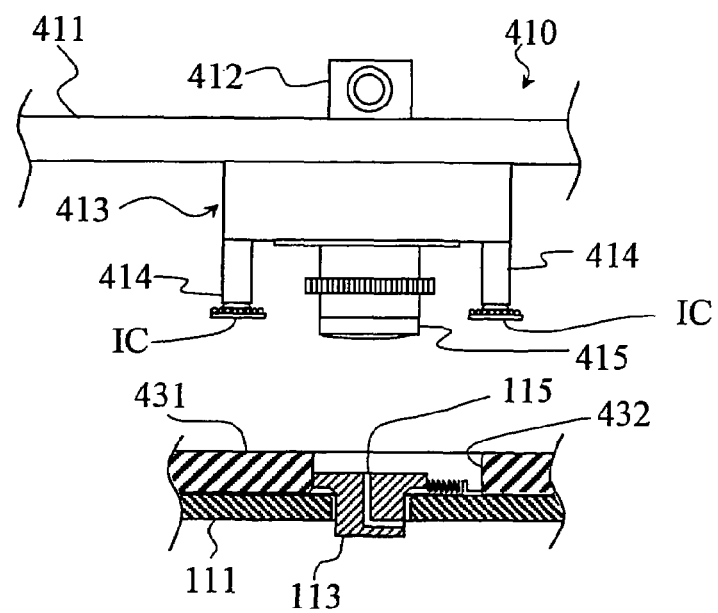
FIG. 20 is a view of the state of a first camera capturing an image of a holder of the test plate.

The operation of steps S50 to S70 are performed for the other IC chip as well, then, as shown in FIG. 20, one movable head 414 is moved so that the first camera 415 is positioned above the holder 113 to be loaded on at the test plate 110 (step S80), then the first camera 415 captures the image of the holding surface 114 positioned below it (step S90).

Note that, in this state, the test plate 110 is positioned at the loading position 101 in the chamber unit 100 and is raised by the elevator mechanism 124 to contact the back surface of the positioning plate 430, whereby the holders 113 of the test plate 110 are inserted into the corresponding openings 432 of the positioning plate 430, the first and second side surfaces 113a, 113b of the holders 113 abut against the first and second inside wall surfaces 432a, 432b of the openings 432 and are pushed by the springs 116 to come into close contact, resulting in the corresponding holders 113 of the test plate 110 being positioned and constrained with respect to the openings 432 of the positioning plate 430.

Figure 21:
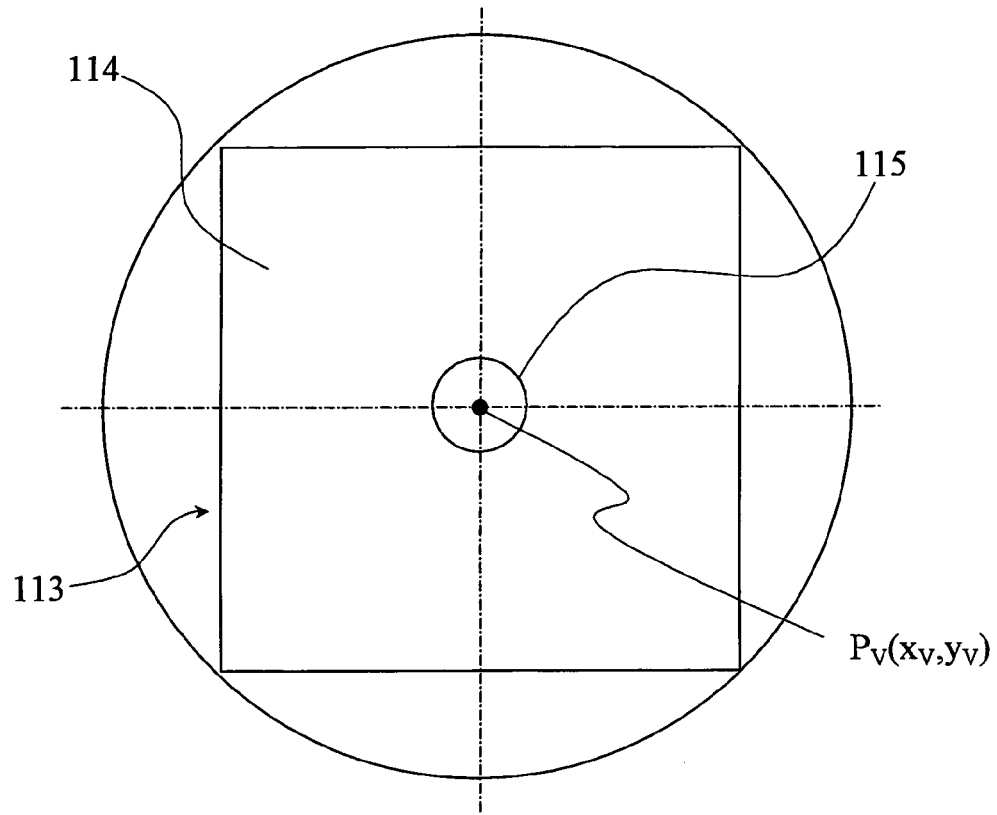
FIG. 21 is a view of an image captured by the first camera in FIG. 20.

Next, the image processing system 450 calculates the coordinates ($x_v$, $y_v$) of the center position $P_v$ of the holding surface 114 and the posture $\theta_v$ of that holding surface from this image information captured by the first camera 415 based on the first coordinate system of the first camera 415 as shown in FIG. 21 and calculates the correction amounts so that that the position & posture ($x_v$, $y_v$, $\theta_v$) of the holding surface 114 and the position & posture ($x_H'$, $y_H'$, $\theta_H'$) of the input/output terminals HB calculated at step S70 match (step S100). At this time, as explained above, by having the first coordinate system of the first camera 415 and the second coordinate system of the second camera 420 correlated for example at the time of startup of the electronic device test apparatus 1, it is possible to calculate the correction amounts so that the position & posture of the input/output terminals HB of the IC chip calculated and the position & posture of the holding surface 114 calculated based on the coordinate system unique to the first camera 415 match.

Note that, in the above way, the holders 113 of the test plate 110 are positioned and constrained by the openings 432 of the positioning plate 430 and the relative positional relationships among the holding surface 114 are unambiguously determined, so the image of the holding surface 113 is captured at step S90 only at the first time when changing the type of the IC chips. Subsequent to that, the initial data is used so as to eliminate this step. It may also be eliminated by the mechanical positional relationship between the IC move system 410 and the positioning plate 430.

Figure 22:
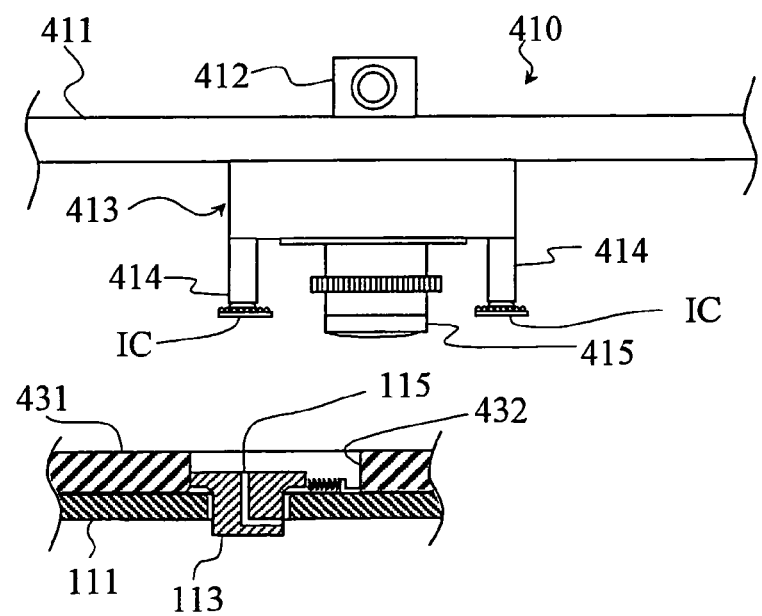
FIG. 22 is a view of the state of the IC move system positioning an IC chip.

The other IC chip as well is subjected to the operation of steps S80 to S100, then, as shown in FIG. 22, the movable head 413 moves so that one IC chip is positioned above the holding surface 114 to be loaded on at the test plate 100. Based on the correction amounts calculated at step S100, the movable head 413 independently drives the pickup part 414 picking up that IC chip so as to position the IC chip with respect to the holding surface 114 of the test plate 110 (step S110).

Figure 23:
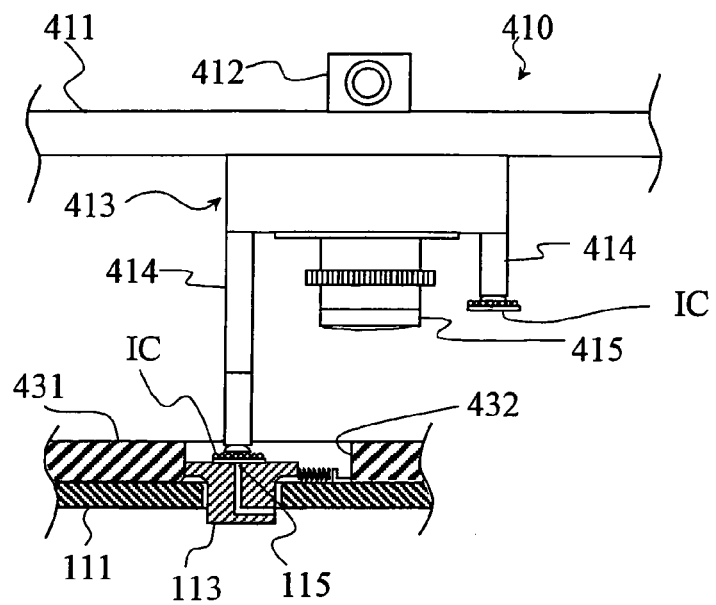
FIG. 23 is a view of the state of the moving means placing an IC chip at a holder of the test plate.
Figure 24:
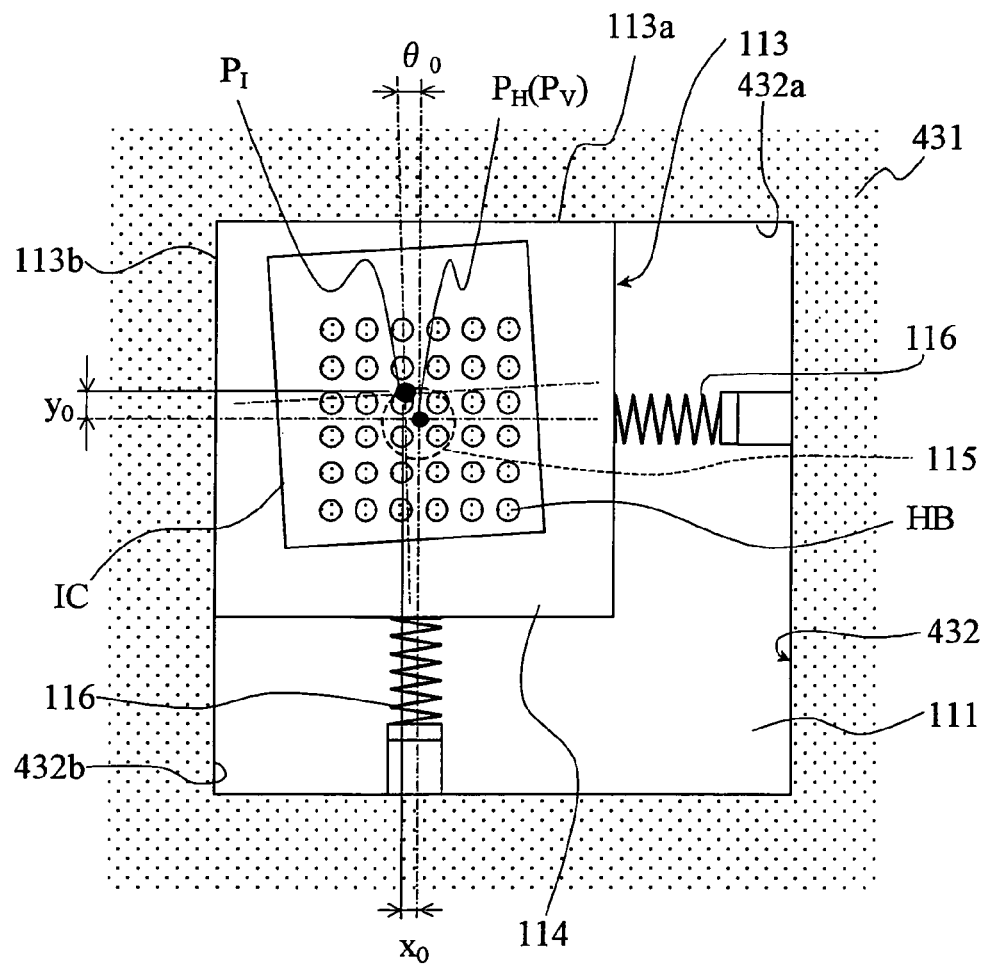
FIG. 24 is a plan view of a holder of the test plate in the state holding an IC chip.

Next, as shown in FIG. 23, that pickup part 414 descends and the suction of the suction pad of that pickup part 414 is stopped to thereby place the IC chip on the holder 113 (step S120). Simultaneously with or before the suction of the suction pad of this pickup part 414 is stopped, the suction of the suction nozzle 115 of the holder 113 of the test plate 110 is started so that the holder 113 holds the IC chip. In this state, as shown in FIG. 24, the IC chip is held at the holder 113 so that the center position $P_v$ & posture of the holding surface 114 and the center of gravity position $P_H$ & posture of the input/output terminals HB substantially match.

The other IC chip is subjected to the operation of steps S110 to S130 to place the other IC chip on the test plate 110, the movable head 414 of the IC move system 410 returns to the second IC conveyor system 320 positioned in the region of the alignment unit 400. The operation from steps S10 to S130 of FIG. 14 is repeated until IC chips are held on all of the holders 113 on the test plate 110 as shown in FIG. 25. While this one movable head 413 of the IC move system 410 is positioning the IC chips, the other movable head 413 is perform similar work for the same test plate 110, therefore, the work times are overlapped and the throughput of the electronic device test apparatus 1 can be improved.

After IC chips are placed at all of the holders 113 on the test plate 110, that test plate 110 is lowered by the elevator mechanism 124 of the plate transport system 120 and placed in the chamber unit 100 where it moves along the corresponding tier of guide rail 121 to the stress position 102. Further, it waits at this stress position 102 for a predetermined time to give the IC chips the desired thermal stress, then moves to the test position 103 where it is raised by the pushing mechanism 125 so that the IC chips held at the holders 113 of the test plate 110 are simultaneously pushed against the corresponding contact units 151 of the test head 150 for testing as shown in FIG. 26. The results of the tests are stored in a storage device of the electronic device test apparatus 1 at addresses determined by for example an identification number given to the test plate 110 and numbers of the IC chips assigned inside the test plate 110.

In pushing the IC chips against the contact units 151, the first side surfaces 113a of the holders 113 of the test plate 110 abut against the first guide surfaces 152 in the vicinities of the contact units 151 and the second side surfaces 113b of the holders 113 of the test plate 110 abut against the second guide surfaces 153 in the vicinities of the contact units 151. Simultaneously with this, springs 116 give pushing forces in the abutting directions. Therefore, these surfaces 113a, 113b, 152, 153 come into close contact and the corresponding holders 113 of the test plate 110 are positioned with respect to the contact units 151 of the test head 150.

Therefore, in this embodiment, since the distances $L_1$, $L_2$ from the first and second guide surfaces 152, 153 to the center position of each contact unit 151 at the test head 150 and the distances $L_3$, $L_4$ from the first and second side surfaces 113a, 113b to the center position $P_v$ of each holding surface 114 at the test plate 110 are the same, each IC chip is held by a holder 113 so that the center position $P_v$ & posture of the holding surface 114 and the center of gravity position $P_H$ & posture of the input/output terminals HB match, and the first and second side surfaces 113a, 113b of each holder 113 of the test plate 110 are positioned by the first and second guide surfaces 152 in the vicinity of the corresponding contact unit 151, the input/output terminals HB of each IC chip can be positioned relative to the contact pins of the corresponding contact unit 151 of the test head 150.

Each after-test IC chip finished being tested at the test head 150 is transported by the plate transport system 120 from the chamber unit 100 to the alignment unit 400, is moved by IC move system 410 from the alignment unit 400 to the loader/unloader unit 300, and is stored by the first IC convey or system 310 of the loader/unloader unit 300 at a customer tray positioned at an eject window 302 corresponding to the test results.

Note that the embodiment explained above was described to facilitate understanding of the present invention and was not described to limit the present invention. Therefore, the elements disclosed in the above embodiment include all design modifications and equivalents falling under the technical scope of the present invention.

In the above embodiments, as examples of the electronic devices, IC chips of the BGA type where ball-shaped input/output terminals are led out are employed, but the present invention is not particularly limited to this. For example, it is also possible to test devices of a type like the LGA type where foil-shaped input/output terminals are led out and other types having back surface where the input/output terminals are not led out and not being impaired even if force is applied to their back surfaces.

Further, in the above embodiments, the relative positions & postures of the input/output terminals with respect to the output shapes of the IC chips were calculated, but the present invention is not particularly limited to this. For example, it is also possible to bury markers in the packages of the IC chips and use the markers to extract the positions & postures of the The ivention claimed is:

1. An electronic device test apparatus for testing DUTs by pushing their input/output terminals against contact units of a test head, comprising:
   a moving device configured to pick up and move the DUTs;
   a first imaging device configured to capture an image of a front surface of the DUT on which the input/output terminals are led out before being picked up by the moving device;
   a second imaging device configured to capture an image of a back surface of the DUT on which the input/output terminals are not led out after being picked up by the moving device; and
   a calculating device configured to calculate the position and posture of the outside shape of the front surface of the DUT before being picked up by the moving device and the position and posture of the input/output terminals of the DUT before being picked up by the moving device from image information captured by the first imaging device, calculate the position and posture of the outside shape of the back surface of the DUT after being picked up by the moving device from image information captured by the second imaging device, and calculate the position and posture of the input/output terminals of the DUT after being picked up by the moving device based on the results of these calculations.

2. An electronic device test apparatus as set forth in claim 1, wherein the moving device has a suction device configured to hold and pick up the DUT by suction.

3. An electronic device test apparatus as set forth in claim 1, wherein the first imaging device is provided at the moving device.

4. An electronic device test apparatus as set forth in claim 1, further comprising:
   a test plate having substantially smooth holding surfaces for holding the back surfaces of the DUTs, wherein
   the moving device places the DUTs on the holding surfaces of the test plate so as to relatively correspond to the array of the contact units, and
   the input/output terminals of the DUTs electrically contact the corresponding contact units of the test head in the state with the DUTs held by the holding surfaces of the test plate in a positional relationship corresponding to the array of the contact units.

5. An electronic device test apparatus as set forth in claim 4, wherein holding surfaces of the test plate have suction device configured to hold the back surfaces of the DUTs by suction.

6. An electronic device test apparatus as set forth in claim 4, wherein the holding surfaces of the test plate hold the DUTs in the state with the input/output terminals of the DUTs directed vertically upward.

7. An electronic device test apparatus as set forth in claim 4, wherein
   the test plate has holders provided in a freely movable manner and
   the holding surfaces are the top surface of the holders.

8. An electronic device test apparatus as set forth in claim 7, wherein
   the contact units are provided with guide parts in their vicinities and
   the holders of the test plate are guided by the guide parts.

9. An electronic device test apparatus as set forth in claim 8, wherein the guide parts have at least two guide surfaces extending in mutually nonparallel directions.

10. An electronic device test apparatus as set forth in claim 9, wherein the moving device places the DUTs on the holders of the test plate after correcting the positions and postures of the DUTs so that the distances from the side surfaces of the holders abutting against the guide surfaces to the DUTs become substantially equal to the distances from the guide surfaces in the vicinities of the contact units to the contact units.

11. An electronic device test apparatus as set forth in claim 9, further comprising pushing device configured to push the holders of the test plate so that the side surfaces of the holders abut against the guide surfaces.

12. An electronic device test apparatus as set forth in claim 11, wherein the pushing device have elastic members and are provided at the test plate.

13. An electronic device test apparatus as set forth in claim 7, further comprising a positioning plate configured to position the holders of the test plate, wherein
    the moving device places the DUTs on the holders of the test plate while correcting their positions and postures in the state with the positioning plate positioning the holders of the test plate.

14. An electronic device test apparatus as set forth in claim 13, wherein
    the positioning plate is formed so that the openings in which holders of the test plate can be inserted correspond to the array of contact units of the test head, and
    the moving device places the DUTs at the holders of the test plate while correcting their positions and postures in the state with the side surfaces of the holders of the test plate abutting against the inside walls of the openings of the positioning plate.

15. An electronic device test apparatus as set forth in claim 14, wherein the pushing device pushes the holders of the test plate so that the side surfaces of the holders of the test plate abut against the inside walls of the openings of the positioning plate.

16. An electronic device test apparatus as set forth in claim 1, wherein the moving device can move the picked up DUTs in any direction and can rotate them in any direction.

17. An electronic device test apparatus for testing DUTs by pushing their input/output terminals against contact units of a test head, comprising:
    a moving device configured to pick up and move the DUTs;
    a first imaging device configured to capture an image of a front surface of the DUT on which the input/output terminals are led out before being picked up by the moving device;
    a second imaging device configured to capture an image of a back surface of the DUT on which the input/output terminals are not led out after being picked up by the moving device;
    a third imaging device configured to capture an image of the back surface of the DUT before being picked up by the moving device; and a calculating device configured to calculate the position and posture of the input/output terminals of the DUT before being picked up by the moving device from the image information captured by the first imaging device, calculate the position and posture of the outside shape of the back surface of the DUT before being picked up by the moving device from the image information captured by the third imaging device, calculate the position and posture of the outside shape of the back surface of the DUT picked up by the moving device from the image information captured by the second imaging device, and calculate the position and posture of the input/output terminals of the DUT picked up by the moving device based on the results of these calculations.

18. A method of testing DUTs pushing their input/output terminals against contact units of a test head, comprising:

capturing a first image of a front surface of a DUT on which the input/output terminals are led out before the DUT is picked up by a moving device configured to pick up and move DUTs;

capturing a second image of a back surface of a DUT on which the input/output terminals are not led out after being picked up by the moving device;

calculating the position and posture of the outside shape of the front surface of the DUT before being picked up by the moving device and the position and posture of the input/output terminals of the DUT before being picked up by the moving device from the first image;

calculating the position and posture of the outside shape of the back surface of the DUT after being picked up by the moving device from the second image; and calculating the position and posture of the input/output terminals of the DUT after being picked up by the moving device based on the results of these calculations.

19. A method of testing DUTs pushing their input/output terminals against contact units of a test head, comprises:

capturing a first image of a front surface of a DUT on which the input/output terminals are led out before the DUT is picked up by a moving device configured to pick up and move DUTs;

capturing a second image of a back surface of a DUT on which the input/output terminals are not led out after being picked up by the moving device;

capturing a third image of the back surface of the DUT before being picked up by the moving device;

calculating the position and posture of the input/output terminals of the DUT before being picked up by the moving device from the first;

calculating the position and posture of the outside shape of the back surface of the DUT before being picked up by the moving device from the third image;

calculating the position and posture of the outside shape of the back surface of the DUT picked up by the moving device from the second image; and calculating the position and posture of the input/output terminals of the DUT picked up by the moving device based on the results of these calculations.

* * * * *